(12) United States Patent
Lewis et al.

(10) Patent No.: US 12,607,413 B2
(45) Date of Patent: Apr. 21, 2026

(54) POLYMER-BASED MICROFABRICATED THERMAL GROUND PLANE

(71) Applicant: KELVIN THERMAL TECHNOLOGIES, INC., Boulder, CO (US)

(72) Inventors: Ryan John Lewis, Boulder, CO (US); Yung-Cheng Lee, Boulder, CO (US); Li-Anne Liew, Westminster, CO (US); Yunda Wang, Denver, CO (US)

(73) Assignee: KELVIN THERMAL TECHNOLOGIES, INC., Boulder, CO (US)

( * ) Notice: Subject to any disclaimer, the term of this patent is extended or adjusted under 35 U.S.C. 154(b) by 637 days.

(21) Appl. No.: 17/592,490

(22) Filed: Feb. 3, 2022

(65) Prior Publication Data

US 2022/0155025 A1 May 19, 2022

Related U.S. Application Data

(63) Continuation of application No. 16/539,848, filed on Aug. 13, 2019, which is a continuation-in-part of
(Continued)

(51) Int. Cl.
F28D 15/04 (2006.01)
B81B 1/00 (2006.01)
(Continued)

(52) U.S. Cl.
CPC .............. *F28D 15/046* (2013.01); *B81B 1/00* (2013.01); *B81C 1/00476* (2013.01);
(Continued)

(58) Field of Classification Search
CPC ..... F28D 15/046; F28F 21/06; F28F 2245/02; F28F 2245/04; F28F 2255/08;
(Continued)

(56) References Cited

U.S. PATENT DOCUMENTS 4,000,776 A 1/1977 Kroebig et al.
4,196,504 A 4/1980 Eastman
(Continued)

FOREIGN PATENT DOCUMENTS

CN 2522409 Y 11/2002
CN 2715467 Y 8/2005
(Continued)

OTHER PUBLICATIONS

International Preliminary Report on Patentability dated May 14, 2019 as received in PCT Application No. PCT/US2017/060550, 7 pages.
(Continued)

*Primary Examiner* — Claire E Rojohn, III

(57) ABSTRACT
Embodiments described herein relate to the concept and designs of a polymer-based thermal ground plane. In accordance with one embodiment, a polymer is utilized as the material to fabricate the thermal ground plane. Other embodiments include am optimized wicking structure design utilizing two arrays of micropillars, use of lithography-based microfabrication of the TGP using copper/polymer processing, micro-posts, throttled releasing holes embedded in the micro-posts, atomic layer deposition (ALD) hydrophilic coating, throttled fluid charging structure and sealing method, defect-free ALD hermetic coating, and compliant structural design.

24 Claims, 25 Drawing Sheets

Related U.S. Application Data application No. 14/857,567, filed on Sep. 17, 2015, now Pat. No. 10,731,925, and a continuation-in-part of application No. 14/853,833, filed on Sep. 14, 2015, now abandoned.

(60) Provisional application No. 62/069,564, filed on Oct. 28, 2014, provisional application No. 62/051,761, filed on Sep. 17, 2014, provisional application No. 62/050,519, filed on Sep. 15, 2014.

(51) Int. Cl.
*B81C 1/00* (2006.01)
*F28F 21/06* (2006.01)
*H05K 7/20* (2006.01)

(52) U.S. Cl.
CPC ......... *F28F 21/06* (2013.01); *H05K 7/20336* (2013.01); *B81C 2201/0107* (2013.01); *B81C 2201/013* (2013.01); *F28F 2245/02* (2013.01); *F28F 2245/04* (2013.01); *F28F 2255/08* (2013.01); *F28F 2260/00* (2013.01)

(58) Field of Classification Search
CPC .... F28F 2260/00; B81B 1/00; B81C 1/00476; B81C 2201/0107; B81C 2201/013
USPC ........................................... 165/104.26, 80.4
See application file for complete search history.

(56) References Cited

U.S. PATENT DOCUMENTS

| | | | |
|---|---|---|---|
| 4,274,479 A | | 6/1981 | Eastman |
| 4,279,294 A * | | 7/1981 | Fitzpatrick .............. F24T 10/40 |
| | | | 165/45 |
| 4,545,799 A * | | 10/1985 | Rhodes ................. H01J 61/366 |
| | | | 313/623 |
| 4,854,379 A * | | 8/1989 | Shaubach ............... F28D 15/04 |
| | | | 122/366 |
| 5,000,256 A * | | 3/1991 | Tousignant ........... H01L 23/433 |
| | | | 165/104.19 |
| 5,157,893 A * | | 10/1992 | Benson .................... B64G 1/22 |
| | | | 52/789.1 |
| 5,175,975 A * | | 1/1993 | Benson ................. F01N 3/2882 |
| | | | 52/794.1 |
| 5,343,940 A * | | 9/1994 | Jean ...................... H01L 23/427 |
| | | | 165/80.4 |
| 5,360,058 A * | | 11/1994 | Koeppl ................. F28D 15/046 |
| | | | 165/274 |
| 5,497,258 A * | | 3/1996 | Ju ....................... G02F 1/13452 |
| | | | 349/149 |
| 5,560,423 A * | | 10/1996 | Larson .................... F28F 21/00 |
| | | | 165/46 |
| 5,735,339 A * | | 4/1998 | Davenport .......... H01L 21/6831 |
| | | | 165/80.1 |
| 6,056,044 A * | | 5/2000 | Benson ................. F28D 15/046 |
| | | | 165/911 |
| 6,082,443 A * | | 7/2000 | Yamamoto .......... H01L 23/3672 |
| | | | 174/15.2 |
| 6,139,974 A * | | 10/2000 | Atkinson ................. F28F 13/00 |
| | | | 72/379.6 |
| 6,158,502 A * | | 12/2000 | Thomas .................. F28D 15/02 |
| | | | 165/185 |
| 6,269,866 B1 * | | 8/2001 | Yamamoto .......... H01L 23/3672 |
| | | | 174/15.2 |
| 6,446,706 B1 * | | 9/2002 | Rosenfeld ............. F28D 15/046 |
| | | | 165/905 |
| 6,533,029 B1 | | 3/2003 | Phillips |
| 6,561,262 B1 * | | 5/2003 | Osakabe .................... F28F 1/40 |
| | | | 165/104.21 |
| 6,619,384 B2 | | 9/2003 | Moon et al. |
| 6,763,671 B1 * | | 7/2004 | Klett ......................... A61F 7/02 |
| | | | 607/108 |

| | | | |
|---|---|---|---|
| 6,896,039 B2 | | 5/2005 | Dussinger et al. |
| 6,901,994 B1 * | | 6/2005 | Jin-Cherng ........... F28D 15/046 |
| | | | 165/185 |
| 6,912,130 B2 * | | 6/2005 | Osanai .................. C04B 37/021 |
| | | | 361/689 |
| 6,938,481 B2 * | | 9/2005 | Paterek ................. C03C 27/042 |
| | | | 73/323 |
| 6,994,151 B2 * | | 2/2006 | Zhou .................... H01L 23/4275 |
| | | | 174/15.1 |
| 7,028,713 B2 | | 4/2006 | Koyama |
| 7,037,400 B1 * | | 5/2006 | Shaw .................... B01J 19/0093 |
| | | | 156/268 |
| 7,069,978 B2 * | | 7/2006 | Rosenfeld ............... G06F 1/203 |
| | | | 138/140 |
| 7,100,680 B2 | | 9/2006 | Dussinger et al. |
| 7,219,713 B2 * | | 5/2007 | Gelorme ................. H01L 23/42 |
| | | | 165/185 |
| 7,278,469 B2 * | | 10/2007 | Sasaki ................... F28D 15/046 |
| | | | 165/46 |
| 7,845,394 B2 | | 12/2010 | Chang et al. |
| 8,018,128 B2 * | | 9/2011 | Egawa ................. H01L 23/473 |
| | | | 165/80.4 |
| 8,069,907 B2 * | | 12/2011 | Bryant .................... F28D 15/04 |
| | | | 361/679.52 |
| 8,074,706 B2 | | 12/2011 | Su et al. |
| 8,243,449 B2 | | 8/2012 | Oniki et al. |
| 8,560,031 B2 | | 10/2013 | Barnett et al. |
| 8,579,018 B1 * | | 11/2013 | Roper .................... F28F 21/06 |
| | | | 165/146 |
| 8,646,281 B2 | | 2/2014 | Lim |
| 8,757,247 B2 * | | 6/2014 | Yang .................... F28D 15/046 |
| | | | 165/104.21 |
| 8,807,203 B2 | | 8/2014 | MacDonald et al. |
| 8,857,502 B2 * | | 10/2014 | Huang ............... F28D 15/0233 |
| | | | 165/104.26 |
| 8,869,878 B2 * | | 10/2014 | Yang ................. F28D 15/0233 |
| | | | 165/104.19 |
| 8,921,702 B1 * | | 12/2014 | Carter .................. H05K 1/0272 |
| | | | 361/689 |
| 8,985,197 B2 | | 3/2015 | Wang |
| 9,127,898 B2 | | 9/2015 | Wong |
| 9,136,883 B1 | | 9/2015 | Moher et al. |
| 9,137,928 B2 | | 9/2015 | Chen et al. |
| 9,149,896 B1 | | 10/2015 | Batty et al. |
| 9,163,883 B2 * | | 10/2015 | Yang ..................... H01L 23/427 |
| 9,179,577 B2 | | 11/2015 | Moon |
| 9,263,366 B2 * | | 2/2016 | Lin ..................... H01L 21/4803 |
| 9,303,927 B2 * | | 4/2016 | Yang .................... F28D 15/046 |
| 9,546,826 B1 | | 1/2017 | Carter et al. |
| 9,597,657 B1 | | 3/2017 | Zhamu et al. |
| 9,600,041 B2 | | 3/2017 | Ady et al. |
| 9,640,747 B2 * | | 5/2017 | Haq ...................... H10N 10/17 |
| 9,651,312 B2 * | | 5/2017 | Yang .................... F28D 15/046 |
| 9,700,930 B2 | | 7/2017 | Yang |
| 9,835,383 B1 * | | 12/2017 | Roper .................. F28D 15/046 |
| 9,909,814 B2 | | 3/2018 | Yang et al. |
| 9,921,004 B2 | | 3/2018 | Lewis et al. |
| 10,066,876 B2 | | 9/2018 | Zhou et al. |
| 10,281,220 B1 | | 5/2019 | Lin et al. |
| 10,446,466 B1 | | 10/2019 | Milne et al. |
| 10,458,719 B2 | | 10/2019 | Bozorgi et al. |
| 10,527,358 B2 | | 1/2020 | Yang et al. |
| 10,544,994 B2 | | 1/2020 | Wakaoka et al. |
| 10,571,200 B2 | | 2/2020 | Yang et al. |
| 10,597,286 B2 | | 3/2020 | Chen et al. |
| 10,674,631 B1 | | 6/2020 | Cheng |
| 10,724,804 B2 | | 7/2020 | Lewis et al. |
| 10,731,925 B2 | | 8/2020 | Lewis et al. |
| 10,973,151 B2 | | 4/2021 | Wakaoka et al. |
| 10,980,148 B2 | | 4/2021 | Cheng |
| 11,054,189 B2 | | 7/2021 | Salim Shirazy et al. |
| 11,054,190 B2 | | 7/2021 | Inagaki et al. |
| 11,058,031 B2 | | 7/2021 | Numoto et al. |
| 11,060,799 B1 | | 7/2021 | Lin |
| 11,150,030 B2 | | 10/2021 | Kishimoto et al. |
| 11,445,636 B2 | | 9/2022 | Wakaoka et al. |
| 11,598,594 B2 | | 3/2023 | Lewis et al. |
| 11,678,464 B2 | | 6/2023 | He et al. |

(56) References Cited

U.S. PATENT DOCUMENTS

| | | | |
|---|---|---|---|
| 11,892,243 B2 | 2/2024 | Huang et al. |
| 11,930,621 B2 | 3/2024 | Lewis et al. |
| 12,120,851 B2 | 10/2024 | Trieu et al. |
| 12,366,419 B2 | 7/2025 | Wang et al. |
| 2001/0054495 A1 | 12/2001 | Yevin et al. |
| 2003/0042009 A1 | 3/2003 | Phillips |
| 2003/0051859 A1 | 3/2003 | Chesser et al. |
| 2003/0079863 A1 | 5/2003 | Sugito et al. |
| 2003/0102118 A1 | 6/2003 | Sagal et al. |
| 2003/0136547 A1 | 7/2003 | Gollan et al. |
| 2003/0136550 A1* | 7/2003 | Tung .................. F28D 15/0233 |
| | | | 257/E23.088 |
| 2003/0136551 A1 | 7/2003 | Bakke |
| 2003/0159806 A1 | 8/2003 | Sehmbey et al. |
| 2004/0011509 A1 | 1/2004 | Siu |
| 2004/0050533 A1 | 3/2004 | Chessar et al. |
| 2004/0131877 A1 | 7/2004 | Hasz et al. |
| 2004/0134548 A1 | 7/2004 | Koyama |
| 2004/0211549 A1* | 10/2004 | Garner .................. F28D 15/046 |
| | | | 431/325 |
| 2004/0244951 A1 | 12/2004 | Dussinger et al. |
| 2005/0059238 A1 | 3/2005 | Chen et al. |
| 2005/0126757 A1 | 6/2005 | Bennett et al. |
| 2005/0190810 A1 | 9/2005 | Butterworth et al. |
| 2005/0230085 A1 | 10/2005 | Valenzuela |
| 2005/0280128 A1 | 12/2005 | Mok et al. |
| 2005/0280162 A1 | 12/2005 | Mok et al. |
| 2006/0032615 A1 | 2/2006 | Dussinger et al. |
| 2006/0037737 A1 | 2/2006 | Chen et al. |
| 2006/0090882 A1 | 5/2006 | Sauciuc |
| 2006/0098411 A1 | 5/2006 | Lee et al. |
| 2006/0124280 A1 | 6/2006 | Lee et al. |
| 2006/0131002 A1 | 6/2006 | Mochizuki et al. |
| 2006/0159916 A1 | 7/2006 | Dubrow et al. |
| 2006/0162905 A1 | 7/2006 | Hsu |
| 2006/0180298 A1 | 8/2006 | Egawa et al. |
| 2006/0196640 A1 | 9/2006 | Siu |
| 2006/0196641 A1 | 9/2006 | Hong et al. |
| 2006/0213648 A1 | 9/2006 | Chen et al. |
| 2006/0283574 A1 | 12/2006 | Huang |
| 2006/0283576 A1 | 12/2006 | Lai et al. |
| 2007/0006993 A1 | 1/2007 | Meng et al. |
| 2007/0012429 A1 | 1/2007 | Siu |
| 2007/0035927 A1 | 2/2007 | Erturk et al. |
| 2007/0056714 A1 | 3/2007 | Wong |
| 2007/0068657 A1 | 3/2007 | Yamamoto et al. |
| 2007/0077165 A1 | 4/2007 | Hou et al. |
| 2007/0089864 A1 | 4/2007 | Chang et al. |
| 2007/0095507 A1 | 5/2007 | Henderson et al. |
| 2007/0107875 A1 | 5/2007 | Lee et al. |
| 2007/0107878 A1 | 5/2007 | Hou et al. |
| 2007/0158050 A1 | 7/2007 | Norley et al. |
| 2008/0017356 A1 | 1/2008 | Gruss et al. |
| 2008/0029249 A1 | 2/2008 | Hsiao |
| 2008/0067502 A1 | 3/2008 | Chakrapani et al. |
| 2008/0111151 A1 | 5/2008 | Teraki et al. |
| 2008/0128116 A1 | 6/2008 | Dangelo et al. |
| 2008/0128898 A1 | 6/2008 | Henderson et al. |
| 2008/0210407 A1 | 9/2008 | Kim et al. |
| 2008/0224303 A1 | 9/2008 | Funakoshi et al. |
| 2008/0272482 A1 | 11/2008 | Jensen et al. |
| 2008/0283222 A1 | 11/2008 | Chang et al. |
| 2009/0020269 A1 | 1/2009 | Chang et al. |
| 2009/0020272 A1 | 1/2009 | Shimizu |
| 2009/0025910 A1 | 1/2009 | Hoffman et al. |
| 2009/0056917 A1 | 3/2009 | Majumdar et al. |
| 2009/0151906 A1 | 6/2009 | Lai et al. |
| 2009/0159242 A1 | 6/2009 | Zhao et al. |
| 2009/0205812 A1 | 8/2009 | Meyer, IV et al. |
| 2009/0236080 A1 | 9/2009 | Lin et al. |
| 2009/0294104 A1 | 12/2009 | Lin et al. |
| 2009/0316335 A1 | 12/2009 | Simon et al. |
| 2010/0028604 A1 | 2/2010 | Bhushan et al. |
| 2010/0053899 A1 | 3/2010 | Hashimoto et al. |
| 2010/0071879 A1 | 3/2010 | Hou |
| 2010/0084113 A1 | 4/2010 | Lee |
| 2010/0139767 A1 | 6/2010 | Hsieh et al. |
| 2010/0157535 A1 | 6/2010 | Oniki et al. |
| 2010/0175854 A1 | 7/2010 | Gratton |
| 2010/0200199 A1 | 8/2010 | Habib et al. |
| 2010/0252237 A1 | 10/2010 | Hashimoto et al. |
| 2010/0254090 A1 | 10/2010 | Trautman |
| 2010/0290190 A1 | 11/2010 | Chester et al. |
| 2010/0294200 A1 | 11/2010 | Zhang et al. |
| 2010/0300656 A1 | 12/2010 | Lu et al. |
| 2011/0017431 A1 | 1/2011 | Yang et al. |
| 2011/0027311 A1 | 2/2011 | Deng et al. |
| 2011/0083829 A1 | 4/2011 | Hung et al. |
| 2011/0088873 A1 | 4/2011 | Yang |
| 2011/0108142 A1 | 5/2011 | Liu et al. |
| 2011/0120674 A1 | 5/2011 | MacDonald et al. |
| 2011/0174474 A1 | 7/2011 | Liu et al. |
| 2011/0198059 A1 | 8/2011 | Gavillet et al. |
| 2011/0205708 A1 | 8/2011 | Andry et al. |
| 2012/0037210 A1 | 2/2012 | Lim |
| 2012/0048516 A1 | 3/2012 | He et al. |
| 2012/0061127 A1 | 3/2012 | Fields et al. |
| 2012/0168435 A1 | 7/2012 | Chen et al. |
| 2012/0186784 A1 | 7/2012 | Yang et al. |
| 2012/0189839 A1 | 7/2012 | Aoki et al. |
| 2012/0241216 A1 | 9/2012 | Coppeta et al. |
| 2012/0312504 A1 | 12/2012 | Suzuki et al. |
| 2012/0325437 A1 | 12/2012 | Meyer, IV et al. |
| 2013/0014919 A1 | 1/2013 | Dai et al. |
| 2013/0043000 A1 | 2/2013 | Wang |
| 2013/0049018 A1 | 2/2013 | Ramar et al. |
| 2013/0168057 A1 | 7/2013 | Semenic et al. |
| 2013/0199770 A1 | 8/2013 | Cherian |
| 2013/0269913 A1 | 10/2013 | Ueda et al. |
| 2013/0327504 A1 | 12/2013 | Bozorgi et al. |
| 2014/0009883 A1 | 1/2014 | Fujiwara et al. |
| 2014/0017456 A1 | 1/2014 | Xiao et al. |
| 2014/0055954 A1 | 2/2014 | Wu |
| 2014/0083653 A1 | 3/2014 | Kempers et al. |
| 2014/0174700 A1 | 6/2014 | Lin et al. |
| 2014/0174701 A1 | 6/2014 | Kare et al. |
| 2014/0237823 A1 | 8/2014 | Yang |
| 2014/0238645 A1 | 8/2014 | Enright |
| 2014/0238646 A1 | 8/2014 | Enright |
| 2014/0247556 A1 | 9/2014 | Eid et al. |
| 2015/0000884 A1 | 1/2015 | Jiang et al. |
| 2015/0181756 A1 | 6/2015 | Sato et al. |
| 2015/0219401 A1 | 8/2015 | Zhang |
| 2015/0226493 A1 | 8/2015 | Yang et al. |
| 2015/0237762 A1 | 8/2015 | Holt et al. |
| 2015/0289413 A1 | 10/2015 | Rush et al. |
| 2016/0018165 A1 | 1/2016 | Ahamed et al. |
| 2016/0076820 A1 | 3/2016 | Lewis et al. |
| 2016/0081227 A1 | 3/2016 | Lee et al. |
| 2016/0123678 A1 | 5/2016 | Hulse et al. |
| 2016/0131437 A1 | 5/2016 | Wu |
| 2016/0161193 A1 | 6/2016 | Lewis et al. |
| 2016/0216042 A1 | 7/2016 | Bozorgi et al. |
| 2016/0252308 A1 | 9/2016 | Strehlow |
| 2016/0295980 A1 | 10/2016 | Wu |
| 2016/0343639 A1 | 11/2016 | Groothuis et al. |
| 2017/0030654 A1 | 2/2017 | Yang et al. |
| 2017/0064868 A1 | 3/2017 | Rush et al. |
| 2017/0122672 A1 | 5/2017 | Lin |
| 2017/0178819 A1 | 6/2017 | Wang et al. |
| 2017/0241717 A1 | 8/2017 | Sun et al. |
| 2017/0292793 A1 | 10/2017 | Sun et al. |
| 2017/0318702 A1 | 11/2017 | Basu et al. |
| 2017/0343293 A1 | 11/2017 | Hurbi et al. |
| 2017/0350657 A1 | 12/2017 | Yeh et al. |
| 2018/0010861 A1 | 1/2018 | Wakoaka et al. |
| 2018/0106554 A1 | 4/2018 | Lewis et al. |
| 2018/0128553 A1 | 5/2018 | Lewis et al. |
| 2018/0164001 A1 | 6/2018 | Schwartz et al. |
| 2018/0320984 A1* | 11/2018 | Lewis .................. H01L 23/427 |
| 2018/0320985 A1 | 11/2018 | Salim Shirazy et al. |
| 2019/0271511 A1 | 9/2019 | Kishimoto et al. |
| 2019/0323780 A1 | 10/2019 | Ahamed et al. |
| 2019/0390919 A1 | 12/2019 | Lewis et al. |

(56) References Cited

U.S. PATENT DOCUMENTS

| | | | |
|---|---|---|---|
| 2020/0003501 A1* | 1/2020 | Wakaoka | F28F 3/12 |
| 2020/0045847 A1 | 2/2020 | Wakaoka et al. | |
| 2020/0045848 A1 | 2/2020 | Wakaoka et al. | |
| 2020/0049421 A1 | 2/2020 | Wakaoka et al. | |
| 2020/0060044 A1 | 2/2020 | Numoto et al. | |
| 2020/0124352 A1 | 4/2020 | Wakaoka et al. | |
| 2020/0182557 A1 | 6/2020 | Lewis et al. | |
| 2020/0221605 A1 | 7/2020 | Vanderwees | |
| 2020/0240718 A1 | 7/2020 | Wakaoka et al. | |
| 2020/0300563 A1 | 9/2020 | Lewis et al. | |
| 2021/0025061 A1 | 1/2021 | Yang et al. | |
| 2021/0136955 A1 | 5/2021 | Wakaoka et al. | |
| 2021/0148646 A1 | 5/2021 | Sun et al. | |
| 2021/0293488 A1 | 9/2021 | Lewis et al. | |
| 2021/0400846 A1* | 12/2021 | Lewis | H01L 23/427 |
| 2022/0120510 A1 | 4/2022 | Wu et al. | |
| 2022/0128314 A1 | 4/2022 | Inagaki et al. | |
| 2022/0294485 A1 | 9/2022 | Li et al. | |
| 2023/0017904 A1 | 1/2023 | Lai et al. | |
| 2023/0019481 A1 | 1/2023 | Jin et al. | |
| 2024/0302108 A1 | 9/2024 | Wong | |
| 2025/0109910 A1 | 4/2025 | Lewis et al. | |

FOREIGN PATENT DOCUMENTS

| | | | |
|---|---|---|---|
| CN | 1672258 A | 9/2005 | |
| CN | 1877241 A | 12/2006 | |
| CN | 1957221 A | 5/2007 | |
| CN | 101022718 A | 8/2007 | |
| CN | 101080359 A | 11/2007 | |
| CN | 101151950 A | 3/2008 | |
| CN | 100480611 C | 4/2009 | |
| CN | 100508708 C | 7/2009 | |
| CN | 101754656 A | 6/2010 | |
| CN | 102019543 A | 4/2011 | |
| CN | 102066864 A | 5/2011 | |
| CN | 202928418 U | 5/2013 | |
| CN | 103398613 A | 11/2013 | |
| CN | 103952729 A | 7/2014 | |
| CN | 209930339 U | 1/2020 | |
| DE | 19729922 C1 | 1/1999 | |
| DE | 202009016739 U1 | 4/2010 | |
| EP | 1369918 A2 | 12/2003 | |
| EP | 1379825 A2 | 1/2004 | |
| EP | 2713132 A1 | 4/2014 | |
| GB | 2529512 A | 2/2016 | |
| JP | H1197871 A | 4/1999 | |
| JP | 2011080679 A | 4/2011 | |
| JP | 2013148289 A | 8/2013 | |
| JP | 2018204841 A | 12/2018 | |
| JP | 2018204941 A | 12/2018 | |
| JP | 2019016883 A | 1/2019 | |
| TW | M544733 U | 7/2017 | |
| WO | 03103835 A1 | 12/2003 | |
| WO | 2006052763 A2 | 5/2006 | |
| WO | 2006115326 A1 | 11/2006 | |
| WO | 2006123049 A2 | 11/2006 | |
| WO | 2007124028 A2 | 11/2007 | |
| WO | 2008044823 A1 | 4/2008 | |
| WO | 2008045004 A1 | 4/2008 | |
| WO | 2008146129 A2 | 12/2008 | |
| WO | 2009079084 A1 | 6/2009 | |
| WO | 2010036442 A1 | 4/2010 | |
| WO | 2013144444 A1 | 10/2013 | |
| WO | 2015172136 A1 | 11/2015 | |
| WO | 2015193153 A1 | 12/2015 | |
| WO | 2016044180 A1 | 3/2016 | |

OTHER PUBLICATIONS

Final Office Action dated May 28, 2019 in U.S. Appl. No. 15/436,632, 14 pages.

Advisory Action dated Jul. 19, 2019 in U.S. Appl. No. 15/292,932, 4 pages.

Advisory Action dated Aug. 22, 2019 in U.S. Appl. No. 15/787,455, 4 pages.

Final Office Action dated Aug. 26, 2019 in U.S. Appl. No. 14/857,567, 27 pages.

Notice of Allowance dated Sep. 12, 2019 in U.S. Appl. No. 15/292,932, 7 pages.

Non-Final Office Action dated Sep. 17, 2019 in U.S. Appl. No. 15/787,455, 20 pages.

Notice of Allowance dated Oct. 10, 2019 in U.S. Appl. No. 15/436,632, 10 pages.

Final Office Action dated Oct. 11, 2019 in U.S. Appl. No. 15/806,723, 18 pages.

Advisory Action dated Nov. 7, 2019 in U.S. Appl. No. 14/857,567, 7 pages.

International Preliminary Report on Patentability dated Nov. 12, 2019 received in PCT Application No. PCT/US2018/031632, 7 pages.

Non-Final Office Action dated Nov. 29, 2019 in U.S. Appl. No. 14/857,567, 32 pages.

Advisory Action dated Feb. 3, 2020 in U.S. Appl. No. 15/806,723, 5 pages.

Restriction Requirement dated Feb. 13, 2020 in U.S. Appl. No. 15/974,306, 5 pages.

Final Office Action dated Feb. 18, 2020 in U.S. Appl. No. 15/787,455, 17 pages.

Office Action mailed Feb. 18, 2020, as received in EP Application No. 15841403.7, 4 pages.

Non-Final Office Action dated Mar. 18, 2020 in U.S. Appl. No. 15/806,723, 6 pages.

International Search Report and Written Opinion dated Apr. 8, 2020 as received in PCT Application No. PCT/US2019/065701, 16 pages.

Office Action mailed Apr. 9, 2020, as received in EP Application No. 15842101.6, 7 pages.

Notice of Allowance dated Apr. 15, 2020 in U.S. Appl. No. 14/857,567, 13 pages.

Notice of Allowance dated Apr. 20, 2020 in U.S. Appl. No. 15/806,723, 8 pages.

Advisory Action dated May 1, 2020 in U.S. Appl. No. 15/787,455, 4 pages.

Non-Final Office Action dated May 29, 2020 in U.S. Appl. No. 15/974,306, 11 pages.

First Office Action received Jun. 1, 2020, in related CN application No. 201910233277.1, 18 Pages.

First Office Action mailed Jun. 4, 2020, as received in CN Application No. 201580050472, 15 pages.

Extended European search report Application mailed Jun. 12, 2020, as received in EP Application No. 17870153.8, 9 pages.

International Search Report and Written Opinion Application mailed Jul. 13, 2020, as received in PCT Application No. PCT/US2020/030911, 9 pages.

First Office Action mailed Jul. 24, 2020, as received in CN Application No. 201910754250, 19 pages.

First Office Action mailed Sep. 24, 2020, as received in CN Application No. 201880030856, 19 pages.

Restriction Requirement dated Oct. 14, 2020 in U.S. Appl. No. 16/539,848, 8 pages.

Non-Final Office Action dated Oct. 26, 2020 in U.S. Appl. No. 16/539,848, 13 pages.

Office Action mailed Nov. 18, 2020, as received in EP Application No. 15841403.7, 5 pages.

Office Action mailed Nov. 17, 2020, as received in EP Application No. 15842101.6, 5 pages.

Extended European search report Application mailed Dec. 16, 2020, as received in EP Application No. 18798835.7, 8 pages.

Final Office Action dated Jan. 11, 2021 in U.S. Appl. No. 15/974,306, 12 pages.

Final Office Action dated Feb. 2, 2021 in U.S. Appl. No. 16/539,848, 10 pages.

Second Office Action mailed Mar. 16, 2021, as received in CN Application No. 201910233277.1, 21 pages.

Advisory Action dated Apr. 9, 2021 in U.S. Appl. No. 16/539,848, 4 pages.

(56)        References Cited

OTHER PUBLICATIONS

Restriction Requirement dated Apr. 9, 2021 in U.S. Appl. No. 16/710,180, 8 pages.
Advisory Action dated Apr. 16, 2021 in U.S. Appl. No. 15/974,306, 4 pages.
Third Office Action mailed Apr. 19, 2021, as received in CN Application No. 201580049534, 7 pages.
Non-Final Office Action dated May 11, 2021 in U.S. Appl. No. 16/539,848, 10 pages.
Non-Final Office Action dated May 17, 2021 in U.S. Appl. No. 15/974,306, 9 pages.
International Preliminary Report on Patentability dated Jun. 8, 2021 as received in PCT Application No. PCT/US2019/065701, 7 pages.
Restriction Requirement dated Jun. 9, 2021 in U.S. Appl. No. 16/680,480, 6 pages.
Non-Final Office Action dated Jul. 9, 2021 in U.S. Appl. No. 15/930,016, 18 pages.
Restriction Requirement dated Jul. 19, 2021 in U.S. Appl. No. 16/710,180, 7 pages.
Restriction Requirement dated Aug. 30, 2021 in U.S. Appl. No. 17/352,250, 7 pages.
Notice of Allowance dated Sep. 9, 2021 in U.S. Appl. No. 15/787,455, 8 pages.
International Search Report and Written Opinion in PCT Application No. PCT/US2021/038152 mailed on Sep. 29, 2021, 14 pages.
Advisory Action in U.S. Appl. No. 16/710,180 dated Sep. 23, 2022, 3 pages.
Final Office Action in U.S. Appl. No. 16/710,180 dated Nov. 14, 2022, 14 pages.
Advisory Action in U.S. Appl. No. 16/539,848 dated Nov. 28, 2022, 3 pages.
Final Office Action in U.S. Appl. No. 16/539,848 dated Sep. 13, 2022, 11 pages.
Non-Final Office Action in U.S. Appl. No. 16/539,848 dated Dec. 29, 2022, 12 pages.
Non-Final Office Action in U.S. Appl. No. 15/930,016 dated Jul. 27, 2022, 16 pages.
Notice of Allowance in U.S. Appl. No. 15/930,016 dated Dec. 1, 2022, 9 pages.
Final Office Action dated May 17, 2023 in U.S. Appl. No. 16/539,848, 10 pages.
Final Office Action in U.S. Appl. No. 16/710,180 dated Mar. 24, 2023, 14 pages.
Final Office Action in U.S. Appl. No. 16/864,236 mailed on Apr. 10, 2023, 11 pages.
Final Office Action in U.S. Appl. No. 17/529,248 mailed on Apr. 25, 2023, 7 pages.
Restriction Requirement dated Apr. 20, 2023 in U.S. Appl. No. 17/666,537, 6 pages.
Non-Final Office Action in U.S. Appl. No. 17/666,537 dated Aug. 1, 2023, 10 pages.
Non-Final Office Action in U.S. Appl. No. 17/529,248 mailed on Dec. 22, 2022, 9 pages.
China Office Action in CN Application No. 201780082663.4 dated Sep. 20, 2022, 22 pages.
Non-Final Office Action in U.S. Appl. No. 16/864,236 dated Oct. 6, 2022, 11 pages.
Non-Final Office Action in U.S. Appl. No. 16/864,236 dated Nov. 29, 2023, 11 pages.
Restriction Requirement dated Jul. 23, 2012 in U.S. Appl. No. 12/719,775, 9 pages.
Non-Final Office Action dated Nov. 9, 2012 in U.S. Appl. No. 12/719,775, 15 pages.
Final Office Action dated May 9, 2013 in U.S. Appl. No. 12/719,775, 15 pages.
Advisory Action dated Aug. 2, 2013 in U.S. Appl. No. 12/719,775, 4 pages.
Non-Final Office Action dated Oct. 2, 2013 in U.S. Appl. No. 12/719,775, 17 pages.

Final Office Action dated Mar. 26, 2014 in U.S. Appl. No. 12/719,775, 23 pages.
Advisory Action dated Jun. 20, 2014 in U.S. Appl. No. 12/719,775, 4 pages.
Non-Final Office Action dated Feb. 6, 2015 in U.S. Appl. No. 12/719,775, 24 pages.
Restriction Requirement dated Jul. 28, 2015 in U.S. Appl. No. 14/681,624, 5 pages.
Notice of Allowance in dated Aug. 4, 2015 U.S. Appl. No. 12/719,775, 9 pages.
Non-Final Office Action dated Oct. 23, 2015 in U.S. Appl. No. 14/681,624, 11 pages.
International Search Report and Written Opinion dated Dec. 18, 2015 as received in PCT Application No. PCT/US2015/050031, 13 pages.
International Search Report and Written Opinion dated Dec. 18, 2015 as received in PCT Application No. PCT/US2015/050771, 13 pages.
Final Office Action dated May 5, 2016 in U.S. Appl. No. 14/681,624, 11 pages.
International Search Report and Written Opinion mailed dated Jul. 15, 2016 as received in PCT Application No. PCT/US2015/057885, 10 pages.
Notice of Allowance dated Nov. 17, 2016 in U.S. Appl. No. 14/681,624, 7 pages.
International Preliminary Report on Patentability dated Mar. 21, 2017 as received in PCT Application No. PCT/US2015/050031, 8 pages.
International Preliminary Report on Patentability dated Mar. 21, 2017 as received in PCT Application No. PCT/US2015/050771, 6 pages.
International Preliminary Report on Patentability dated May 2, 2017 as received in PCT Application No. PCT/US2015/057885, 5 pages.
Preinterview First Office Action dated May 9, 2017 in U.S. Appl. No. 14/861,708, 9 pages.
Non-Final Office Action dated Aug. 9, 2017 in U.S. Appl. No. 14/925,787, 16 pages.
Restriction Requirement dated Aug. 30, 2017 in U.S. Appl. No. 14/853,833, 7 pages.
Final Office Action dated Sep. 28, 2017 in U.S. Appl. No. 14/925,787, 9 pages.
Non-Final Office Action dated Oct. 6, 2017 in U.S. Appl. No. 14/853,833, 13 pages.
Notice of Allowance dated Oct. 25, 2017 in U.S. Appl. No. 14/861,708, 9 pages.
US Notice of Allowance dated Nov. 9, 2017 in U.S. Appl. No. 14/925,787, 7 pages.
Preinterview First Office Action dated Nov. 21, 2017 in U.S. Appl. No. 14/857,567, 12 pages.
International Search Report and Written Opinion mailed dated Jan. 17, 2018 as received in PCT Application No. PCT/US2017/060550, 13 pages.
Extended European search report Application mailed Feb. 22, 2018, as received in EP Application No. 15842101.6, 7 pages.
Final Office Action dated Mar. 8, 2018 in U.S. Appl. No. 14/857,567, 25 pages.
Extended European search report mailed Mar. 26, 2018, as received in EP Application No. 15841403.7, 10 pages.
Final Office Action dated Apr. 25, 2018 in U.S. Appl. No. 14/853,833, 12 pages.
First Office Action mailed May 9, 2018, as received in CN Application No. 201580049534, 13 pages.
Advisory Action dated May 30, 2018 in U.S. Appl. No. 14/857,567, 7 pages.
Non-Final Office Action dated Aug. 2, 2018 in U.S. Appl. No. 14/857,567, 30 pages.
First Office Action mailed Aug. 28, 2018, as received in CN Application No. 201580059333, 10 pages.
Restriction Requirement dated Aug. 30, 2018 in U.S. Appl. No. 15/292,932, 5 pages.
Non-Final Office Action dated Sep. 27, 2018 in U.S. Appl. No. 15/787,455, 15 pages.

(56) References Cited

OTHER PUBLICATIONS

Restriction Requirement dated Oct. 10, 2018 in U.S. Appl. No. 15/436,632, 5 pages.

International Search Report and Written Opinion mailed dated Oct. 15, 2018 received in PCT Application No. PCT/US2018/031632, 15 pages.

Final Office Action dated Oct. 30, 2018 in U.S. Appl. No. 14/857,567, 28 pages.

Non-Final Office Action dated Nov. 19, 2018 in U.S. Appl. No. 14/853,833, 11 pages.

Non-Final Office Action dated Dec. 11, 2018 in U.S. Appl. No. 15/292,932, 13 pages.

Second Office Action mailed Dec. 29, 2018, as received in CN Application No. 201580049534, 14 pages.

Non-Final Office Action dated Feb. 5, 2019 in U.S. Appl. No. 15/436,632, 10 pages.

Non-Final Office Action dated Mar. 21, 2019 in U.S. Appl. No. 14/857,567, 28 pages.

Final Office Action dated Mar. 29, 2019 in U.S. Appl. No. 14/853,833, 12 pages.

Final Office Action dated Mar. 29, 2019 in U.S. Appl. No. 15/292,932, 13 pages.

Final Office Action dated Apr. 1, 2019 in U.S. Appl. No. 15/787,455, 20 pages.

Non-Final Office Action dated Apr. 5, 2019 in U.S. Appl. No. 15/806,723, 12 pages.

Non-Final Office Action dated Oct. 5, 2021 in U.S. Appl. No. 16/680,480, 12 pages.

Non-Final Office Action dated Nov. 5, 2021 in U.S. Appl. No. 17/352,250, 17 pages.

Non-Final Office Action dated Nov. 8, 2021 in U.S. Appl. No. 15/787,455, 17 pages.

Final Office Action dated Nov. 29, 2021 in U.S. Appl. No. 16/539,848, 11 pages.

Non-Final Office Action dated Dec. 13, 2021 in U.S. Appl. No. 16/710,180, 14 pages.

Final Office Action dated Dec. 17, 2021 in U.S. Appl. No. 15/930,016, 19 pages.

Restriction Requirement in U.S. Appl. No. 16/864,236 dated Feb. 7, 2022, 8 pages.

Advisory Action dated Feb. 9, 2022 in U.S. Appl. No. 16/539,848, 4 pages.

Final Office Action dated Feb. 24, 2022 in U.S. Appl. No. 15/787,455, 24 pages.

Notice of Allowance dated Feb. 28, 2022 in U.S. Appl. No. 16/680,480, 9 pages.

Final Office Action dated Mar. 11, 2022 in U.S. Appl. No. 17/352,250, 17 pages.

Non-Final Office Action dated Mar. 28, 2022 in U.S. Appl. No. 16/539,848, 11 pages.

Final Office Action dated Apr. 7, 2022 in U.S. Appl. No. 16/710,180, 15 pages.

Notice of Allowance in U.S. Appl. No. 17/666,537 dated Feb. 15, 2024, 9 pages.

Final Office Action in U.S. Appl. No. 16/864,236 mailed on Jun. 7, 2024, 11 pages.

Non-Final Office Action in U.S. Appl. No. 16/864,236 mailed on Dec. 20, 2024, 13 pages.

International Search Report and Written Opinion in PCT Application No. PCT/US2024/027116 mailed on Sep. 4, 2024, 12 pages.

Junjiao, H., et al., "Development of heat pipe cooling technology in high heat flux electronic components", Chemical Industry and Engineering Progress, Chemical Industry and Engineering Progress, vol. 34, Issue. 5, pp. 1220-1231 (May 5, 2015).

Restriction Requirement in U.S. Appl. No. 18/666,811 dated Dec. 5, 2024, 5 pages.

Non-Final Office Action in U.S. Appl. No. 17/951,075 mailed on Jun. 4, 2024, 21 pages.

Final Office Action in U.S. Appl. No. 17/951,075 mailed on Nov. 20, 2024, 20 pages.

Restriction Requirement in U.S. Appl. No. 18/004,059 dated May 2, 2024, 7 pages.

Restriction Requirement in U.S. Appl. No. 18/004,059 dated Sep. 30, 2024, 7 pages.

Non-Final Office Action in U.S. Appl. No. 18/180,122 mailed on Nov. 15, 2024, 17 pages.

Final Office Action in U.S. Appl. No. 16/864,236 mailed on Jul. 28, 2025, 12 pages.

Notice of Allowance in U.S. Appl. No. 17/529,248 mailed on Aug. 18, 2025, 7 pages.

Notice of Allowance in U.S. Appl. No. 18/004,059 mailed on Aug. 21, 2025, 5 pages.

Final Office Action in U.S. Appl. No. 18/980,091 mailed on Sep. 25, 2025, 12 pages.

Non-Final Office Action in U.S. Appl. No. 18/963,254 mailed on Oct. 1, 2025, 13 pages.

Restriction Requirement in U.S. Appl. No. 18/651,657 mailed on Oct. 2, 2025, 6 pages.

Final Office Action in U.S. Appl. No. 17/951,075 mailed on Oct. 8, 2025, 16 pages.

Non-Final Office Action in U.S. Appl. No. 18/454,061 mailed on Oct. 8, 2025, 10 pages.

Notice of Allowance in U.S. Appl. No. 16/539,848 mailed on Oct. 15, 2025, 14 pages.

Non-Final Office Action in U.S. Appl. No. 16/864,236 mailed on Nov. 6, 2025, 11 pages.

Non-Final Office Action in U.S. Appl. No. 18/980,091 mailed on Dec. 18, 2025, 8 pages.

Non-Final Office Action in U.S. Appl. No. 18/651,657 mailed on Dec. 19, 2025, 14 pages.

International Search Report and Written Opinion in PCT Application No. PCT/US2024/038965 mailed on Oct. 30, 2024, 11 pages.

Non-Final Office Action in U.S. Appl. No. 17/951,075 mailed on Mar. 4, 2025, 21 pages.

Non-Final Office Action in U.S. Appl. No. 18/004,059 mailed on Mar. 31, 2025, 10 pages.

Non-Final Office Action in U.S. Appl. No. 18/666,811 mailed on Apr. 8, 2025, 8 pages.

Notice of Allowance in U.S. Appl. No. 18/180,122 mailed on May 12, 2025, 10 pages.

Non-Final Office Action in U.S. Appl. No. 16/710,180 mailed on May 16, 2025, 22 pages.

Non-Final Office Action in U.S. Appl. No. 16/539,848 mailed on Jun. 20, 2025, 11 pages.

* cited by examiner

100

100

Posts etched through copper, Filled
with polymer structural material

Releasing Hole

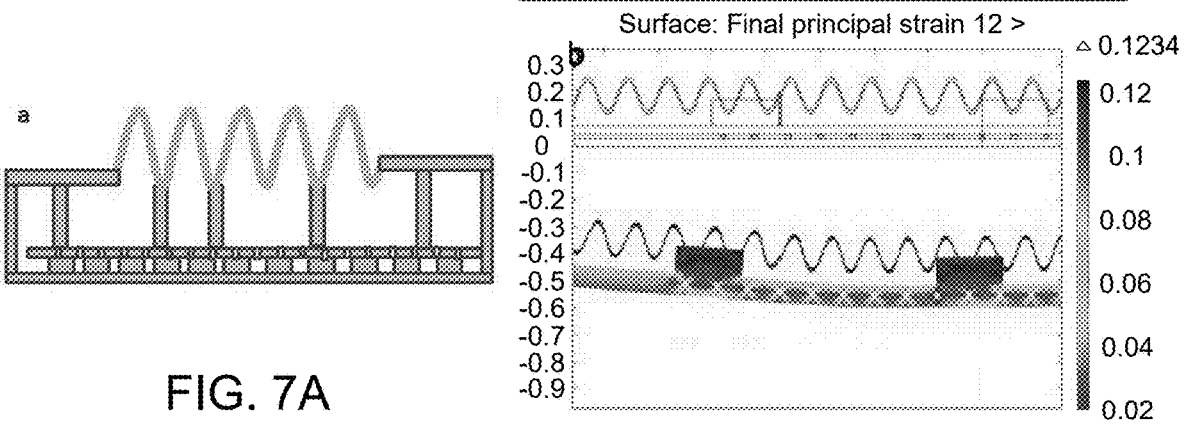
FIG. 7A
FIG. 7B
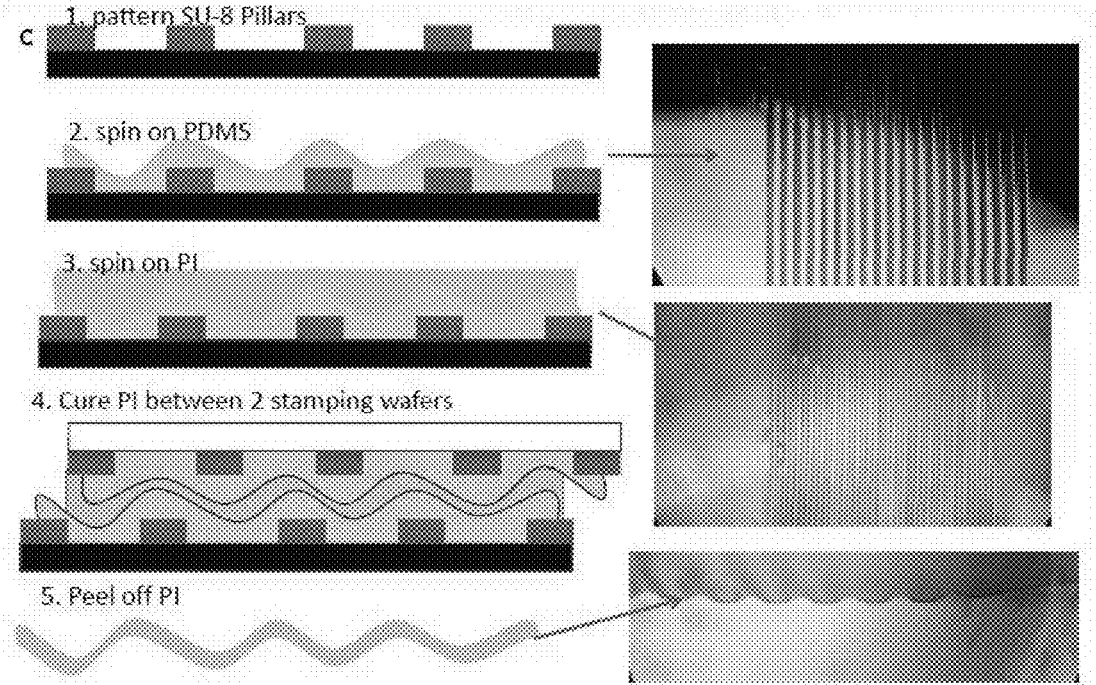
FIG. 7C

PDMS Stamp

Polyimide (i)  ALD hydrophilic coating; sea (j)  Evacuation; water charging (k)  Sealing charging ports (l)  ALD hermetic coating

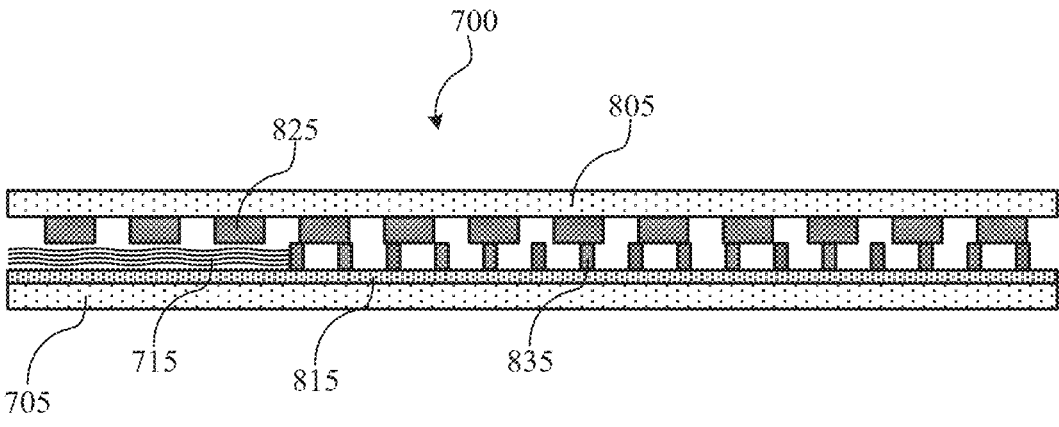
*(Section A)*
*Figure 22A*
*(Section B)*
*Figure 22B*
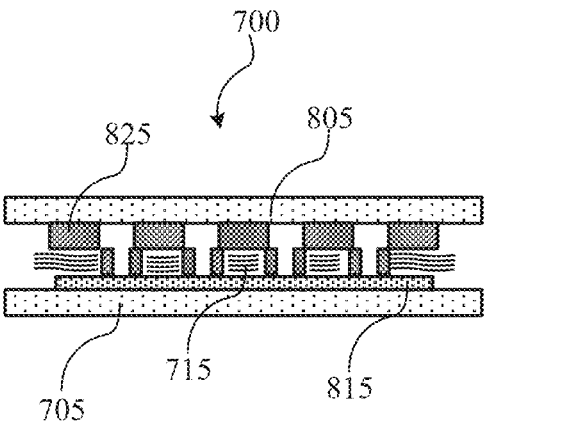
*(Section C)*
*Figure 22C*

POLYMER-BASED MICROFABRICATED THERMAL GROUND PLANE

CROSS-REFERENCE TO RELATED APPLICATIONS

This application is a non-provisional of U.S. Provisional Patent Application No. 62/069,564, filed Oct. 28, 2014, titled POLYMER-BASED MICROFABRICATED THERMAL GROUND PLANE; and is incorporated into this disclosure by reference in their entireties.

This application is a Continuation-In Part of patent application Ser. No. 14/857,567, filed Sep. 17, 2015, titled MICROPILLAR-ENABLED THERMAL GROUND PLANE; which claims priority to U.S. Provisional Patent Application No. 62/069,564, filed Oct. 28, 2014, titled POLYMER-BASED MICROFABRICATED THERMAL GROUND PLANE; and U.S. Provisional Patent Application No. 62/051,761, filed Sep. 17, 2014, titled MICROPILLAR-ENABLED THERMAL GROUND PLANE, all of which are incorporated into this disclosure by reference in their entireties.

This application is a Continuation-In Part of patent application Ser. No. 14/853,833, filed Sep. 14, 2015, titled VACUUM-ENHANCED HEAT SPREADER; which claims priority to U.S. Provisional Patent Application No. 62/069,564, filed Oct. 28, 2014, titled POLYMER-BASED MICROFABRICATED THERMAL GROUND PLANE; U.S. Provisional Patent Application No. 62/051,761, filed Sep. 17, 2014, titled MICROPILLAR-ENABLED THERMAL GROUND PLANE; and U.S. Provisional Patent Application No. 62/050,519, filed Sep. 15, 2014, titled VACUUM-ENHANCED HEAT SPREADER, all of which are incorporated into this disclosure by reference in their entireties.

STATEMENT AS TO RIGHTS TO INVENTIONS MADE UNDER FEDERALLY SPONSORED RESEARCH AND DEVELOPMENT

This invention was made with government support under Grant No. N66001-08-C-2006 awarded by DOD/DARPA. The government has certain rights in the invention.

SUMMARY

Some embodiments of the invention relate to polymer-based microfabricated thermal ground planes (TGP) and methods for manufacturing the same. In accordance with some embodiments, a polymer is utilized as the material to fabricate the thermal ground plane. Other embodiments include an optimized wicking structure utilizing two arrays of micropillars, use of lithography-based microfabrication of the TGP using copper/polymer processing, micro-posts, throttled releasing holes embedded in the micro-posts, atomic layer deposition (ALD) hydrophilic and hydrophobic coatings, throttled fluid charging structure and sealing method, defect-free ALD hermetic coating, and compliant structural design.

Some embodiments of the invention include a method for forming a thermal ground plane. The method can include the following depositing a first polymer layer on a substrate; depositing a first sacrificial layer in a first pattern on the first polymer layer; depositing a second polymer later on the first sacrificial layer; depositing a second sacrificial layer on the second polymer layer, depositing a first masking layer on the second polymer layer having a plurality of exposed regions that expose portions of the second polymer layer; etching portions of the second polymer layer that are exposed by the first masking layer; removing the first masking layer; depositing a sacrificial vapor core layer in a pattern on the second sacrificial layer; depositing a third polymer layer on the sacrificial vapor core layer; depositing a second masking layer on the third polymer layer having a plurality of exposed regions that expose portions of the third polymer layer; etching portions of the third polymer layer that are exposed by the second masking layer; removing the second masking layer; removing portions of the sacrificial vapor core layer using the holes in the third polymer layer; removing the substrate; and/or sealing the holes in the third polymer layer.

In some embodiments, after removing portions of the sacrificial vapor core layer the third polymer layer forms a plurality of pillars.

In some embodiments, the first pattern comprises a negative of a plurality of pillars.

In some embodiments, the second polymer layer comprises a mesh layer.

In some embodiments, the masking layer comprises a metal. In some embodiments, the masking layer comprises a plurality of exposed regions.

In some embodiments, the sacrificial vapor core layer may be electroplated on the second polymer layer. In some embodiments, the vapor core layer may include a plurality of pillars.

In some embodiments, removing portions of the sacrificial vapor core layer using the holes in the third polymer layer further comprises introducing an introducing an acid through the holes in the third polymer layer.

In some embodiments, the sacrificial vapor core layer has a thickness of less than 200 microns. In some embodiments, the second polymer layer has a thickness of less than 50 microns. In some embodiments, the first polymer layer has a thickness of less than 50 microns.

In some embodiments, removing portions of the sacrificial vapor core layer using the holes in the third polymer layer further comprises removing portions of the first sacrificial layer.

In some embodiments, depositing a third polymer layer on the sacrificial vapor core layer further comprises depositing the third polymer layer into cavities or channels in the sacrificial vapor core layer.

Some embodiments include thermal ground plane. The thermal ground plane may include a bottom layer; a mesh layer bonded with the bottom layer a vapor core having a plurality of pillars bonded with the mesh layer; and a top layer.

In some embodiments, either or both the top layer and the bottom layer comprise an in-plane wavy structure. In some embodiments, either or both the top layer and the bottom layer comprise an out-of-plane wavy structure.

In some embodiments, either or both the top layer and the bottom layer comprise a polymer. In some embodiments, the plurality of pillars comprise a polymer. In some embodiments, the mesh layer comprises a polymer.

In some embodiments, the mesh layer comprises one or more pillars and/or one or more microposts. In some embodiments, the one or more pillars have a star cross-section shape.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

FIG. 7A illustrates an out of plane structure schematic according to some embodiments.

FIG. 7B illustrates an out of plane compliant structure according to some embodiments.

FIG. 7C illustrates an example process flow to fabricate an out-of-plane wavy structure according to some embodiments.

FIG. 22A shows a side view of TGP cut through Section A shown in FIG. 21.

FIG. 22B shows a side view of TGP cut through Section B shown in FIG. 21.

FIG. 22C shows an end view of TGP 700 cut through Section C shown in FIG. 21.

DETAILED DESCRIPTION

Thermal management can be an important element in micro systems in order to remove heat away from sensitive electronic and photonic components. Among passive thermal management techniques, heat pipes using phase-change heat transfer processes can have effective thermal conductivities an order of magnitude higher than any solid. Embodiments described herein may use polymer material to fabricate the entire TGP structure. This may allow for ultra-thin and/or flexible device. The polymer may allow monolithic fabrication process to minimize the assembly and even ease the integration with the cooling target.

Some embodiments may have many features such as, for example, a wicking structure design utilizing two or more arrays of micro-posts, microfabrication of the TGP using copper/polymer processing, micro-posts supporting the vapor core to minimize deformation under high pressure, throttled releasing holes embedded in the micro-posts, atomic layer deposition (ALD) hydrophilic and/or hydrophobic coatings, throttled fluid charging structure, defect-free ALD hermetic coating, and/or compliant structural design, etc.

Figure 1A:
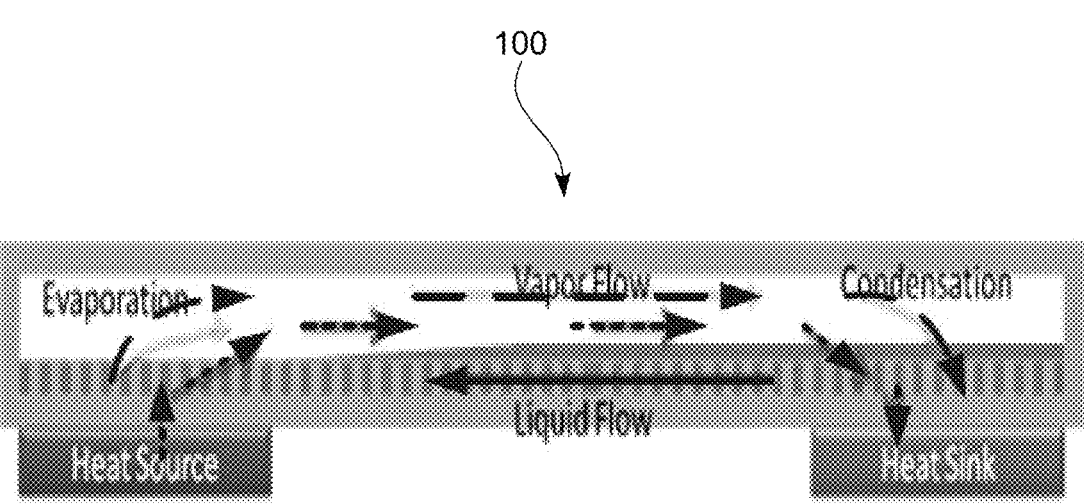
FIG. 1A illustrates the operational principle of a TGP according to some embodiments.
Figure 1B:
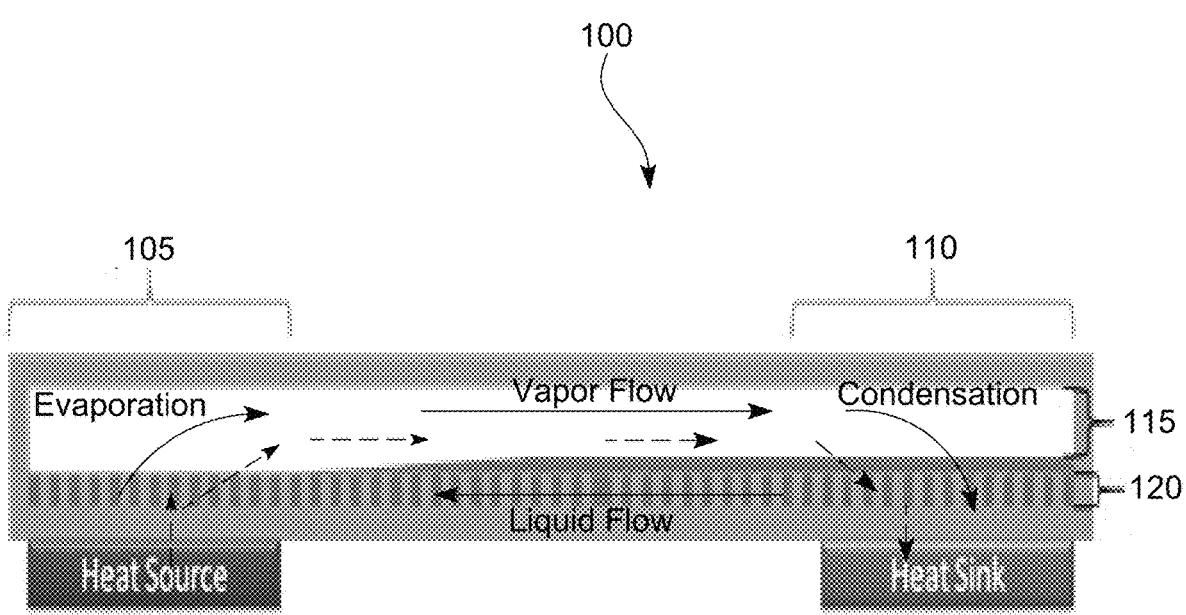
FIG. 1B illustrates a TGP with an evaporator, vapor core, condenser, and liquid wicking structure according to some embodiments.

In some embodiments, a thermal ground plane may be a passive thermal management device that uses phase-change processes to achieve thermal transport with low thermal resistance. FIGS. 1A and 1B shows an example of a polymer-based super-thin TGP 100 according to some embodiments. FIG. 1A illustrates the operational principle of TGP 100, showing heat flow with dotted lines, vapor flow in dashed lines, and liquid flow in solid lines.

The TGP 100 shown in FIG. 1B includes an evaporator 105, vapor core 115, condenser 110, and liquid wicking structure 120. In TGP 100, a heat transfer fluid (HTF) such as, for example, water and/or ammonia, in both liquid and vapor phases may be disposed within an internal cavity of the TGP. Heat may be absorbed at one section (the evaporator 105), causing the HTF in that area to evaporate. The heat may be carried by the evaporated HTF through the vapor core 115 to the cold section (the condenser 110) where the HTF condenses and rejects the heat from the condenser 110 to the outside. The now liquid-phase HTF is pulled back to the evaporator 105 with capillary forces that result from the geometry and surface chemistry of the liquid wicking structure 120, resulting in a closed fluid circulation cycle which experiences liquid-vapor phase-change including evaporation and condensation. The liquid wicking structure 120 may include pillars and/or a mesh (e.g., a woven metallic or polymer mesh).

In some embodiments, the wicking structure 120 may be fabricated as an array of microposts. The design of such a micropost array can be optimized in such a manner to minimize the thermal resistance between the evaporator 105 and the condenser 110, while maintaining certain geometric constraints such as a prescribed height, width, and/or length of the entire device, and/or operation parameters such as average temperature and wattage of heat to be transported. The optimization process may include two steps: first an acceptable range of pillar array geometries may be determined that prevents the system from experiencing dry-out, then the geometry which minimizes thermal resistance may be found from within that range.

Dry-out may occur when liquid is not pumped back to the evaporator 105 from the condenser 110 through the wick as fast as it is evaporated in the evaporator 105. The liquid wicking structure 120 may provide enough capillary pumping pressure to overcome pressure losses associated with the vapor flow through the vapor core 115 and liquid flow through the wicking structure 120. A denser array of pillars may, for example, lead to greater capillary pumping pressure but also higher liquid pressure drop. In some embodiments, in order to lower the pressure drop associated with the wicking structure 120, a second array of microposts with a wider geometry may be fabricated between the evaporator 105 and the condenser 110.

Figure 2A:
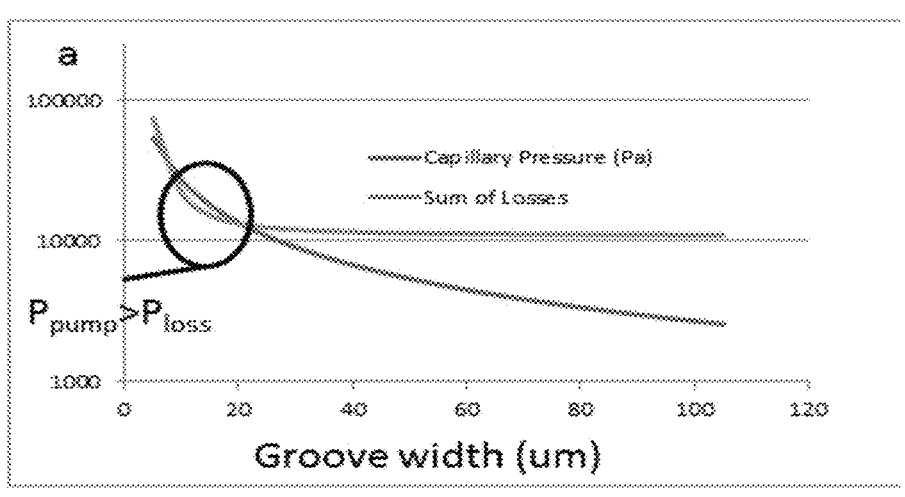
FIG. 2A is a graph illustrating a range of possible micropost geometries for a given constraint to prevent dry-out, with capillary pressure calculated according to the Young-Laplace equation and viscous pressure drops calculated according to Poiseuille's Law.

FIG. 2A is a graph illustrating a range of possible micropost geometries for a given constraint to prevent dry-out, with capillary pressure calculated according to the Young-Laplace equation and viscous pressure drops calculated according to Poiseuille's Law. In this example, the constrained total height is 0.2 mm, the operating temperature is 325 K, and the dissipating heat is 5 W.

Figure 2B:
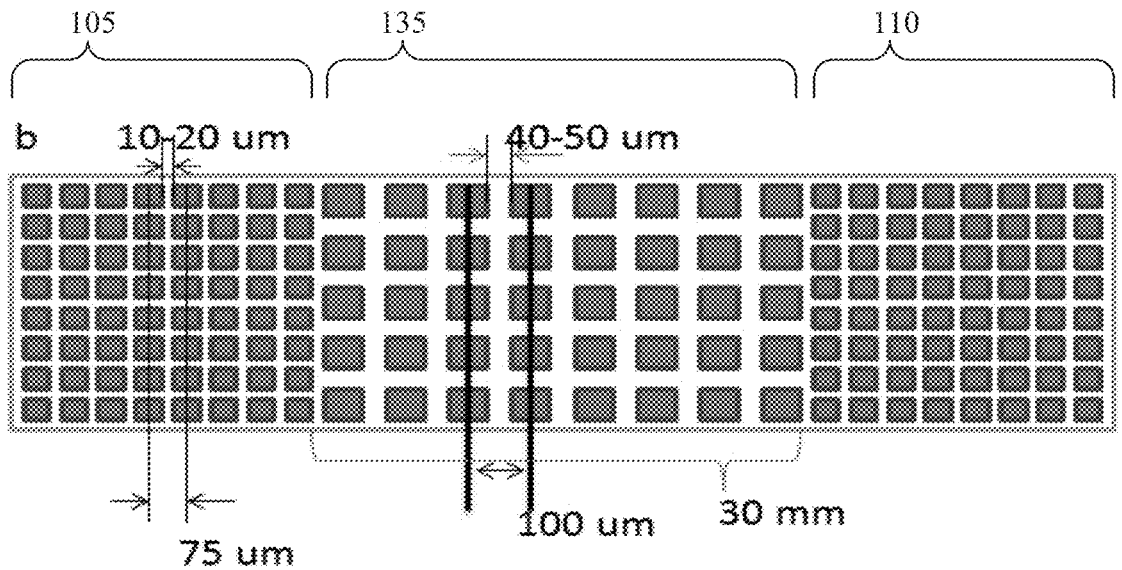
FIG. 2B is a schematic of a micropost design for a wicking structure 120 with two different array geometries in two different regions.

FIG. 2B is a schematic of a micropost design for a wicking structure 120 with two different array geometries in two different regions. A first region may include either or both the evaporator region 105 and/or the condenser region 110. A second region may include an axis region 135. For example, the cross-sectional area of the pillars in the first region may be greater than the cross-sectional area of the pillars in the second region. As another example, the space between adjacent pillars (e.g., the average space between adjacent pillars) in the first region may be different than the space between adjacent the pillars in the second region.

Once a range of geometries is found, the thermal resistance of all acceptable geometries may also be found. Some details about finding thermal resistances may include thermal conduction through the solid casing material and/or vapor transport losses. Total thermal resistances in an acceptable regime are shown in FIG. 2b for given constraints according to some embodiments.

Some embodiments may include fabrication of a TGP. For example, some embodiments may include microfabrication of a TGP using copper/polymer processing that may allow the geometric features to be controlled by lithography. This may allow, for example, for control of the geometry in order to attain any type of thermal performance.

Figure 3A:
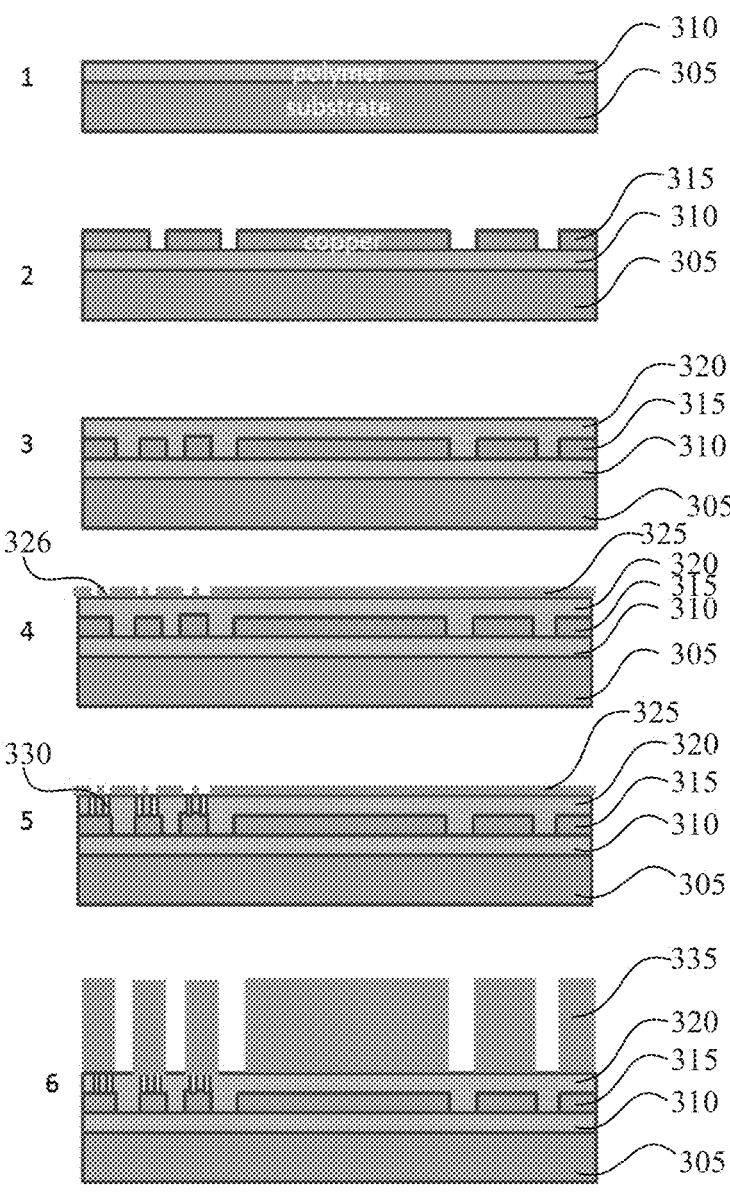
FIGS. 3A and 3B illustrate an example process for fabricating a TGP according to some embodiments.
Figure 3B:
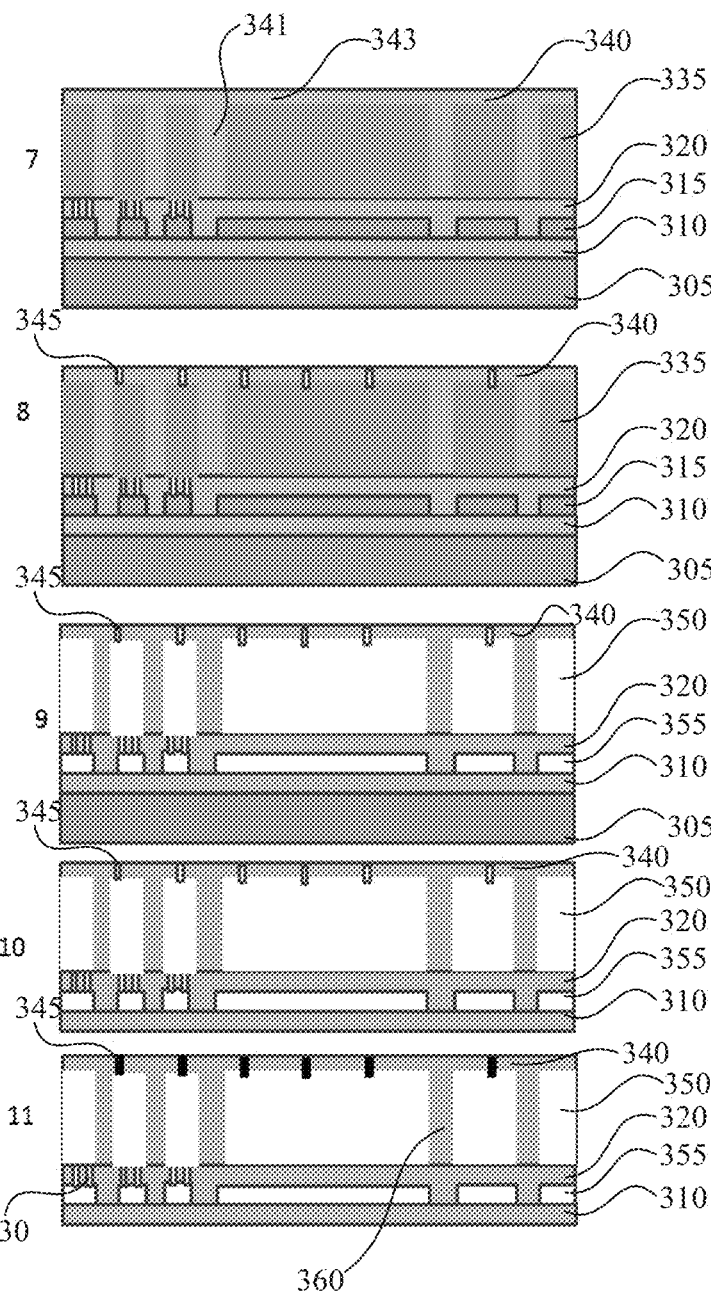

FIGS. 3A and 3B illustrate a process 300 for fabricating a TGP according to some embodiments. Although illustrated as discrete blocks, various blocks may be divided into additional blocks, combined into fewer blocks, or eliminated, depending on the desired implementation.

At block 1, a polymer 310 may be deposited onto a substrate 305 using any polymer deposition technique known in the art, such as, for example, casting, painting, thermal spray, dipping, and/or spin-coating. The substrate 305 may include a glass substrate. The polymer may include any type of polymer material such as, for example, polyimide or any other polymer material.

At block 2, a first sacrificial layer 315 may be deposited on the polymer 305. In some embodiments, the first sacrificial layer may include a plurality of pillars. The plurality of pillars, for example, may have any number of sizes and/or patterns. The first sacrificial metallic layer 315 may include a metal such as, for example, copper, aluminum, etc. In some embodiments, the first sacrificial layer 315 may be deposited on the polymer layer 310 by first depositing a seed layer and then electroplating the sacrificial layer 315 to the desired height. In some embodiments, the first sacrificial layer 315 may be etched into a negative having a pillar pattern using a photolithographic technique. In some embodiments, the etched away regions of the metal may become polymer pillars using a polymer processing technique including casting, painting, thermal spray, dipping, and spin-coating.

At block 3, a second polymer 320 may be deposited onto the sacrificial layer 315 and/or the first polymer layer 310. The second polymer 320, for example, may include a pillar and mesh layer (e.g., a woven metallic or polymer mesh layer). The second polymer 320, for example, may fill at least a portion of etched portions of the sacrificial layer 315 and/or cavities in the sacrificial layer 315.

At block 4, a masking layer 325, for example, comprising a metal such as copper, may be deposited on the polymer 320. The shape, designed and/or pattern of the masking layer 325 may be defined by photolithography and/or may be etched. For instance, the masking layer 325 may have exposed regions 326.

At block 5, etching such as, for example, reactive ion etching (ME) or any other etching technique may be used to remove portions of the second polymer layer 320 exposed by the exposed regions of the masking layer 325. This etching may create the mesh structure 330 within the second polymer 320 layer. Following the etching, the masking layer 325 may be removed.

At block 6, a sacrificial vapor core layer 335 may be deposited on the second polymer layer 320. The sacrificial vapor core layer 335 may comprise a metal such as, for example, copper. In some embodiments, the sacrificial vapor core layer 335 may be electroplated on the second polymer layer 320. Support cavities and/or inverted pillars and/or sidewalls in the sacrificial vapor core layer 335, for example, may be defined into the vapor core layer using any type of photolithography and/or etching technique.

Turning to FIG. 3B, at block 7, a third polymer layer 340 may be deposited onto and/or into cavities in the sacrificial vapor core layer 335. The third polymer layer 340 may include pillars 341, side-walls, and/or a top layer 343. In some embodiments, the pillars may have a circular, polygonal, square, rectangular, or star shaped cross-section.

At block 8, a second masking layer may be deposited in a pattern to form release holes using a lithography technique. The second masking layer may be etched away along with the portions of the third polymer layer 340 beneath the release holes creating release holes 345 through the polymer layer.

At block 9 the sacrificial vapor core layer 335 may be removed with an acid that is introduced through the release holes 345 creating the vapor core 350. The sacrificial layer 315 may be removed with the acid that is introduced through the release holes 345 creating the liquid channel 355.

At block 10, the device may be removed from the substrate 305 with a substrate etchant (for example, hydrofluoric acid for a glass substrate).

At block 11, the releasing holes 345 may be filled with a polymer or epoxy to seal the top layer.

In some embodiments, the polymer layer 310 may have a thickness less than about 50 microns such as, for example, less than 25, 20, 15, 10, etc. microns.

In some embodiments, the third polymer layer 340 may have a thickness less than about 50 microns such as, for example, less than 25, 20, 15, 10, etc. microns.

In some embodiments, the vapor core 350 may have a thickness less than about 500 microns such as, for example, less than 250, 200, 150, 100, etc. microns.

In some embodiments, the liquid channel may have a thickness less than about 50 microns such as, for example, less than 25, 20, 15, 10, etc. microns.

Although process 300 is illustrated as discrete blocks, the various blocks of FIG. 3 may be divided into additional blocks, combined into fewer blocks, or eliminated, depending on the desired implementation.

In some embodiments, materials other than copper can be used as the sacrificial layer(s) 315. These materials may include metals, as well as other polymers that can be subsequently released, for example thermally or photolithically decomposable polymers such as polycarbonate or norbornene-based polymers.

Various other manufacturing techniques may be used. For example, a sheet of rolled copper forming a copper base may be used for the vapor core. On this copper base, for example, the mesh structure 330 may be formed. The mesh structure 330, for example, may be electroplated through lithographically-defined polymer electroplating masks. In some embodiments, the copper may grow into the shape desirable for the formation of a negative of the wicking structure. Once the wicking structure is electroplated, the masks may be removed, and replaced by a structural polymer. The copper composing the vapor core can then be patterned and etched to define the supporting pillars and sidewalls. This fabrication method may, for example, replace all or portions of blocks 1-6.

Figure 4:
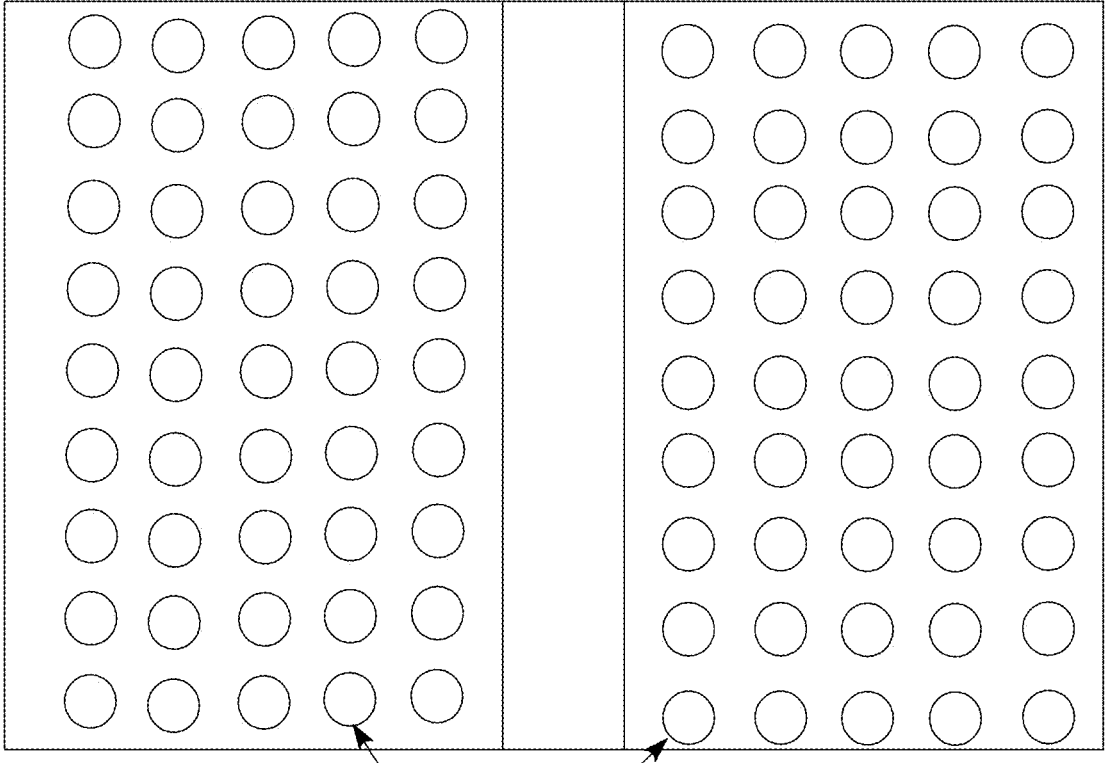
FIG. 4 shows an example array of micro pillars.

In some embodiments, if the heat transfer fluid (HTF) experiences temperatures above its normal boiling temperature, there may be a positive pressure difference between the vapor core of the TGP and the outside ambient. In some embodiments, if the HTF ever experiences temperatures below its normal boiling temperature, there will be a negative pressure difference between the vapor core of the TGP and the atmosphere around it. In some embodiments, pillars 360 may be embedded into the vapor core 350 to eliminate deformation of the top layer in the presence of pressure differentials. The pillars 360, for example, may be defined by etching the sacrificial copper that forms the vapor core. An example, of such micro pillars is shown in FIG. 4. In some embodiments, the pillars 360 may have a circular, oval, polygonal, square, star cross-sectional shape.

Figure 5A:
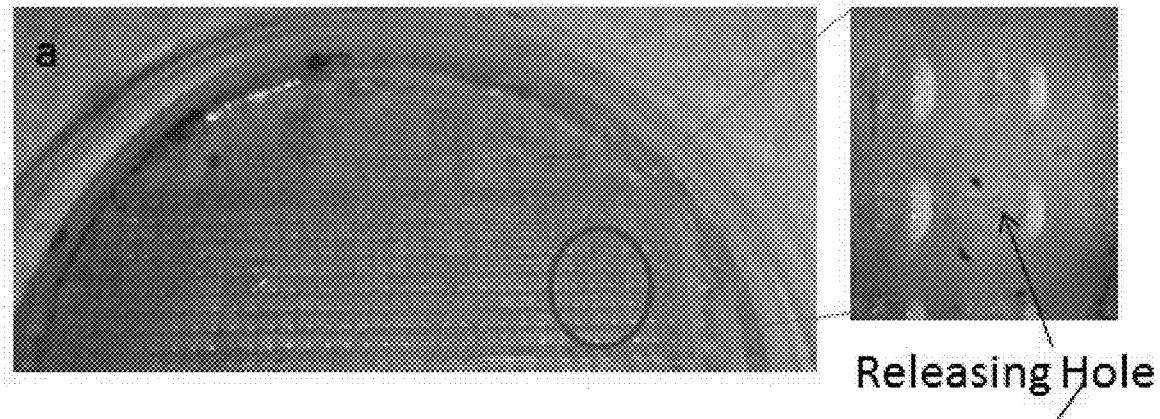
FIG. 5A illustrates throttled releasing holes in a TGP after copper release, before a releasing hole is filled with epoxy.
Figure 5B:
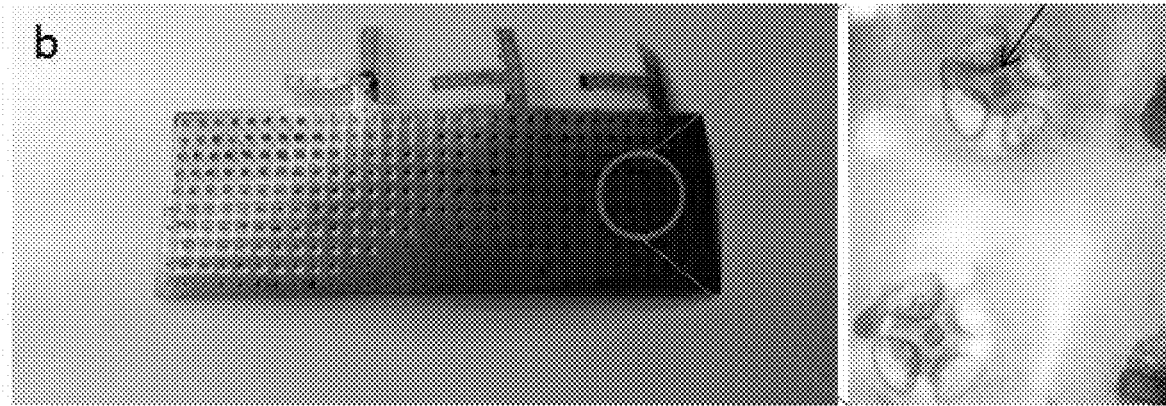
FIG. 5B illustrates throttled releasing holes in a TGP after a releasing hole is filled with epoxy.

In some embodiments, the releasing holes 345 may be filled with sealing material in order to seal the top polymer layer. In some embodiments, the sealing material may be introduced as a viscous fluid into the releasing holes 345 that are suspended above the vapor core channel may provide some control over where the fluid will flow. Capillary forces may pull the fluid away from the releasing hole, preventing sealing and causing flow resistance in the vapor core after the sealing fluid solidifies. Furthermore, when the TGP is flexed, the polymer or epoxy may crack. In order to gain control of the flow of the sealing fluid before it solidifies; the releasing holes may be embedded in the pillars, with a throttled channel connecting the releasing hole to the sacrificial copper of the vapor core, as shown in FIGS. 5A and 5B. When polymer or epoxy is introduced as sealing fluid into the releasing hole 345, the throttled structure may prevent it from spreading into the vapor core 350. In some embodiments, when the TGP is flexed, the solid structure of the pillar will lower the stress around the polymer or epoxy material and decrease the chances of cracks forming.

FIG. 5A illustrates throttled releasing holes in a TGP after copper release, before a releasing hole is filled with epoxy. FIG. 5B illustrates throttled releasing holes in a TGP after a releasing hole is filled with epoxy. In some embodiments, epoxy is prevented from entering the vapor core by the throttled design.

In some embodiments, the mesh structure 330 may have a surface chemistry that results in a low or high contact angle with the heat transfer fluid. For example, a hydrophilic and/or a hydrophobic coating may be applied to the mesh structure 330 to enhance evaporation or condensation. Atomic layer deposition (ALD), for example, may be used to provide a conformal layer of hydrophobic or hydrophilic coatings onto the surfaces of the mesh structure 330. This deposition may take place before the release holes 345 are filled. Precursors to the ALD film can diffuse from a flow area above the TGP through the releasing holes, such that they deposit on the interior surface. In some embodiments, an adhesion layer of $Al_2O_3$ may be followed by a hydrophilic or hydrophobic layer.

Figure 6:
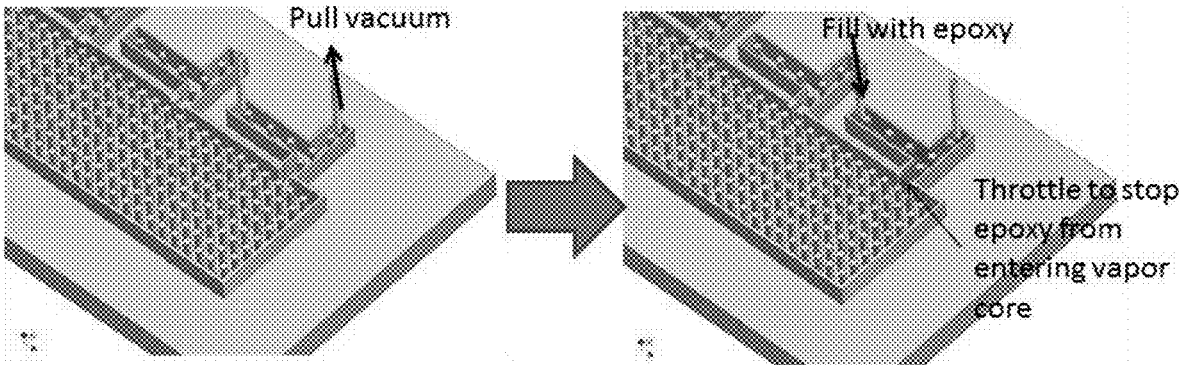
FIG. 6 illustrates an example structure and/or sealing method.

In some embodiments, the TGP may be evacuated with a vacuum, charged with a heat transfer fluid, and/or the charging region may be subsequently sealed. To facilitate this, a charging structure may be fabricated. The charging structure may include a "T" junction. This structure may be patterned into the vapor core layer, and may include microposts to prevent the channel from collapsing when the system is evacuated. One arm of the "T" connects to a macro-scale vacuum purge and fluid-charge system, while the other arm of the "T" connects to an epoxy injection system. Once the system is evacuated of non-condensable gasses and charged with heat transfer fluid, epoxy may be injected into the charging structure. A throttle at the end of the charging structure may prevent the epoxy from entering the vapor core. In some embodiments, once the epoxy is cured, the charging structure may be cut away. An example structure and/or sealing method is/are shown in FIG. 6.

Polymers may not be hermetic, and they may allow diffusion of small molecules including air molecules through them. In some embodiments, the flow of gas molecules into the vapor core of the TGP introduces non-condensable gasses, and the flow of HTF out of the TGP constitutes a leak—both of which can be stopped by applying an ALD inorganic barrier coating to the outer area and/or surface of the TGP. ALD films will further prevent leaks through the epoxy used to seal the fluid charging structures and releasing holes. In some embodiments, to provide a defect-free film, a polymer thin film may be used to encapsulate any micron-sized particles or surface roughness associated with the processing or charging. Furthermore, after the ALD films are deposited, a polymer thin film may be used to encapsulate and protect the ALD films.

Although polymers can provide a naturally compliant material for the TGP, the ALD inorganic films may crack under moderate strain. In order to prevent cracking or similar damage when the TGP is bent with a small radius, in some embodiments, a compliant structure may be implemented. The compliant structure, for example, may reduce the strain associated with bending. In some embodiments, there may be two components to a compliant structure: an out-of-plane structure and an in-plane structure. In various embodiments, one or both may be used.

An example out-of-plane structure, which involves wavy structures in the top-most polymer layer, is shown in FIG. 7A. The wavy structures can reduce the stiffness of the top-most layer, moving the neutral axis closer to the bottom layer, therefore reducing the stress and strain at the bottom when the TGP is bent, as shown in FIG. 7B. Such a structure can be fabricated by forming a base micro-patterned mold (either by isotropic etching in the vapor-core sacrificial copper layer, or patterning with other photo-definable polymers), coating the top polymer layer, and pressing of the top polymer layer with a micro-patterned mold as the polymer cures, as shown in FIG. 7C.

FIG. 7A illustrates an out of plane structure schematic according to some embodiments. FIG. 7B illustrates an out of plane compliant structure reducing strain in the top and bottom layers to less than 1%.

FIG. 7C illustrates an example process flow to fabricate the out-of-plane wavy structures, including photographs of out-of-plane polymer wavy structures fabricated with this process. This process shows method to produce the structure using photo-definable SU-8 followed by a polydimethyl siloxane (PDMS) layer to round the corners of the SU-8 and provide a barrier to prevent solvent incompatibility between the PDMS and the polyimide (PI).

Figure 8:
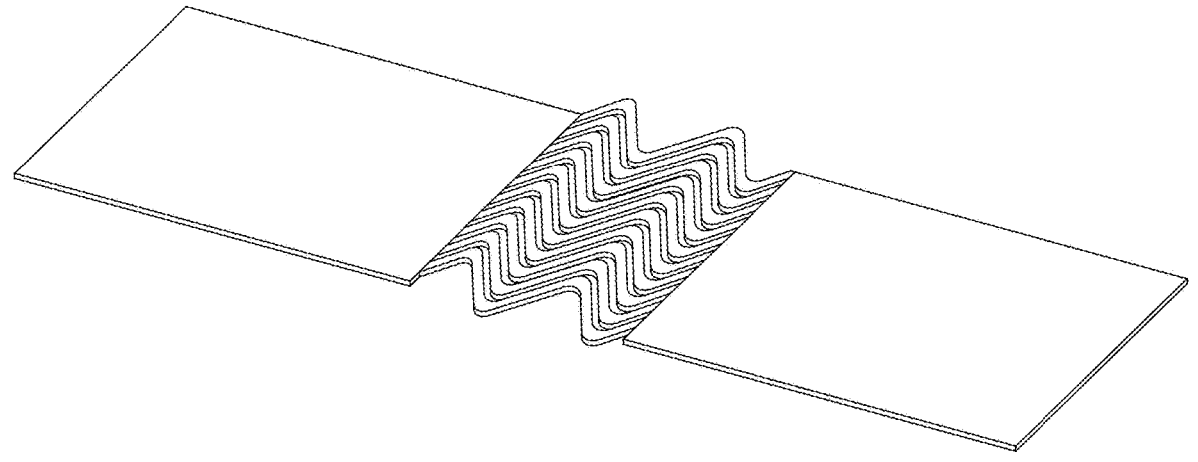
FIG. 8 illustrates an example in plane structure.

An example in-plane structure is shown in FIG. 8. Multiple parallel channels through which the liquid and vapor may flow are fabricated where the TGP will experience flexing. These channels will be given a wavy-profile in the plane of the polymer casting. In some embodiments, no additional processing may be needed to fabricate these structures. Both the gap between the parallel channels and the walls of the channels will be minimized in size, in order to maximize the flow area and reduce the associated pressure drop. Wavy structures with large amplitude, short pitch, and thin channels may increase the compliance, while at increasing the pressure drop. In some embodiments, an optimization process may be used to select the geometry of the wavy structure that meets both the compliance criteria and minimize the associated pressure drop.

In some embodiments, strain can be reduced if just one side of the layers includes sinusoidal-wavy structures, which may have an amplitude that is significantly thinner than the layer thickness and/or thicker than the ALD film thickness. In some embodiments, the sinusoidal-wavy may have a wavelength no more than 5× the amplitude. For example, the optimized wavy structure may have an amplitude of 2 μm and wavelength of 10 μm.

Figure 9:
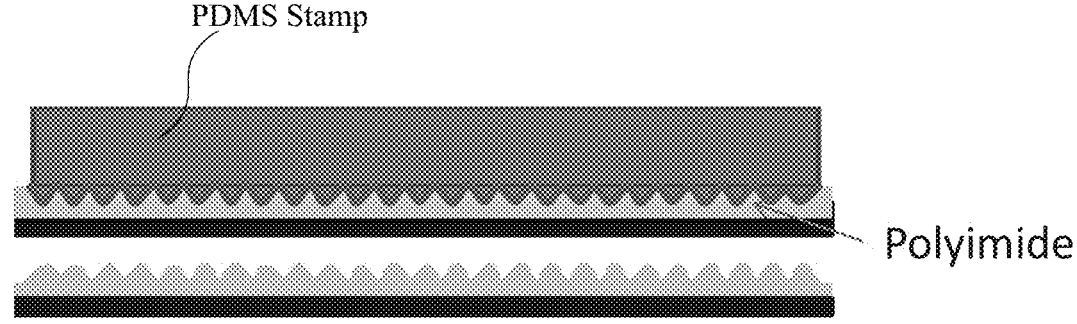
FIG. 9 illustrates a structure fabricated using a PDMS mold.

In some embodiments, this structure can be fabricated using a PDMS mold that is stamped into polyimide as it cures, as shown in FIG. 9.

Figure 10:
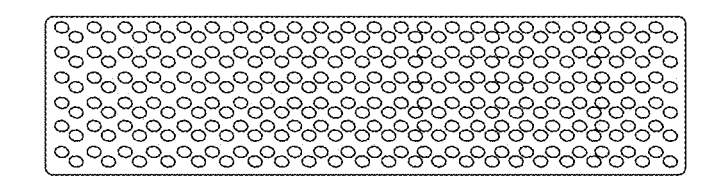
FIG. 10 illustrates a TGP with a laminated perimeter according to some embodiments.

In some embodiments, the fabrication of a TGP can be made without release-holes. For example, the pillars may be completely solid and/or etchant may be allowed to enter the TGP from the perimeter. In this case, the perimeter can be sealed by a flexible thermo-forming or thermo-setting polymer, such as fluorinated ethylene propylene (FEP), through a lamination process. FIG. 10 illustrates a TGP with a laminated perimeter according to some embodiments.

In some embodiments, the size and/or spacing of the pillars may vary based on need. For example, a wide spacing can cause the top and bottom layers to collapse, narrowing the hydraulic diameter and increasing the internal pressure drop. For example, a narrow spacing may result in too many pillars taking up the cross-sectional area that should be devoted to a flow path, resulting in a higher pressure drop.

Figures 11A, 11B:
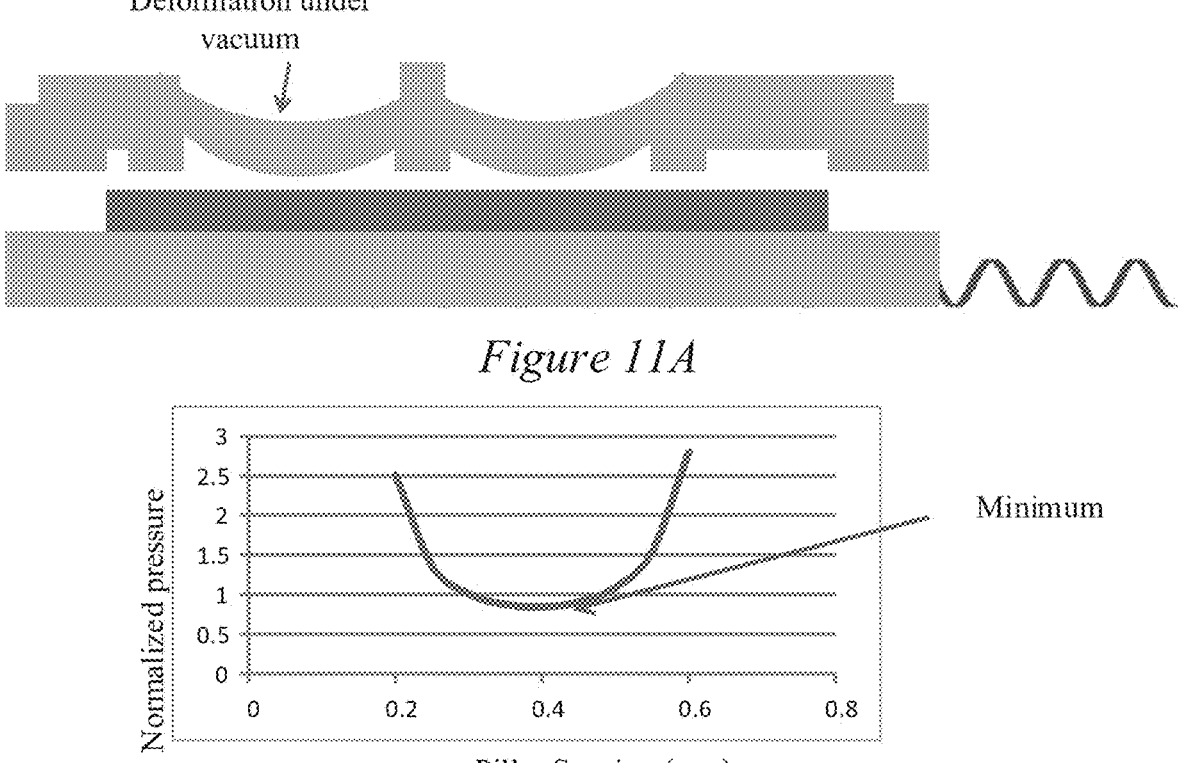
FIG. 11A is a schematic illustration of a pillar spacing problem.
FIG. 11B illustrates an optimization curve for optimized pillar spacing according to some embodiments.

In some embodiments, an optimum or nearly optimum pillar spacing can be found by minimizing the pressure drop through a given cross-sectional geometry as a function of pillar spacing, as shown in FIG. 11B. In this example geometry, the optimal spacing is 0.4 mm.

FIG. 11A is a schematic illustration of a pillar spacing problem and FIG. 11B illustrates an optimization curve for optimized pillar spacing according to some embodiments.

Some fabrication methods can cause leakage through the final spin-coating layers. To avoid these leaks, in some embodiments, further sealing of the structure may be facilitated by laminating a continuous sheet of thermosetting or thermoforming polymer covering the surface.

In some embodiments, condensation of the liquid along the top layer of the TGP may result in restrictions to the flow of vapor, and thus degrading the performance. The liquid can be dispersed through a mesh structure along the top layer. This can be formed for example by etching or electroplating an array micropillars into the sacrificial copper after the pillar-structure has been defined. This can occur, for example, after step 6 in FIG. 3.

Figure 12A:
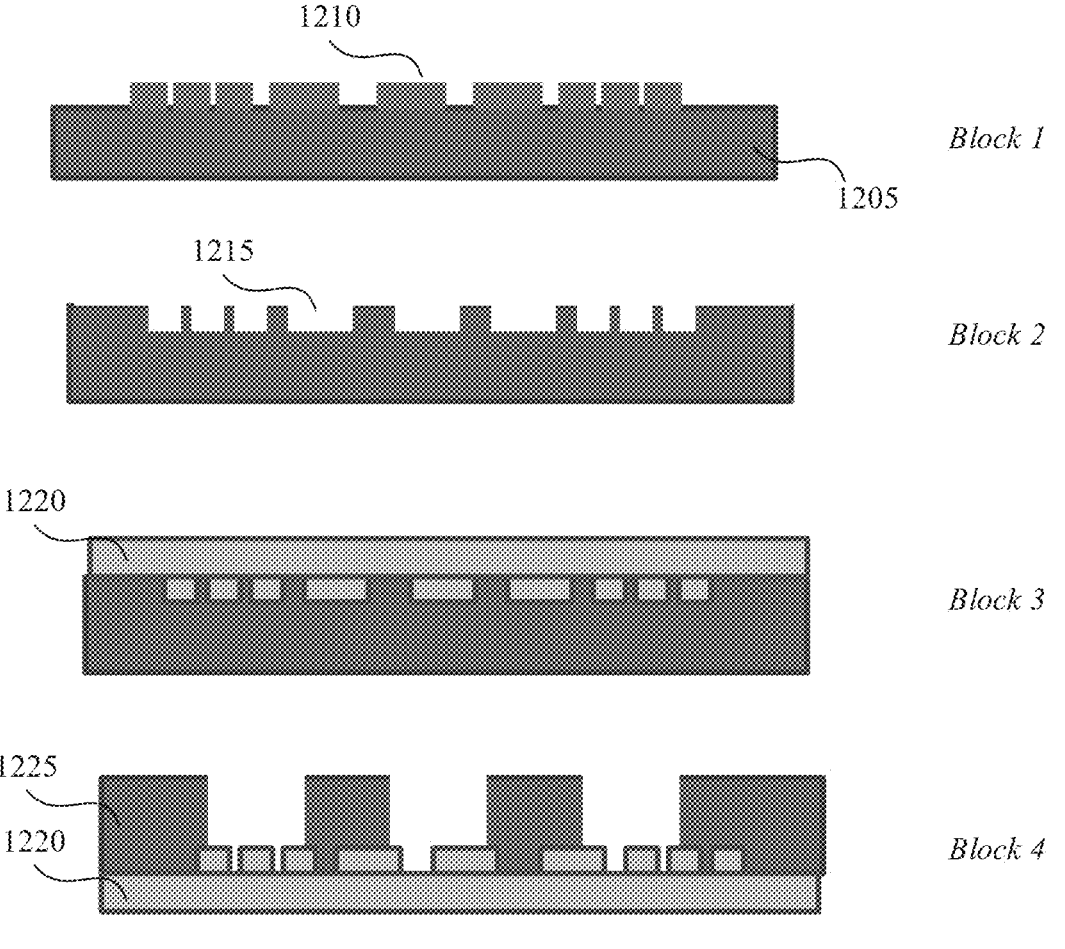
FIGS. 12A and 12B illustrate an example process for fabricating a TGP according to some embodiments.

Some embodiments may include an alternative to the fabrication scheme shown in FIG. 3. For example, the fabrication may be based around metal foil as the sacrificial layer which eventually defines the largest layer, e.g. the vapor core. Starting with the foil, the fabrication may proceed as shown in FIG. 12A.

At block 1, a micropillar scaffold 1210 may be photo-patterned onto the bottom of a foil 1205.

At block 2, micropillars may be etched through the scaffold 1210 to form the image of the wicking structure 1215.

At block 3, a polymer-coating 1220 may be deposited on the foil 12-5, which may form at least a portion of the wicking structure.

At block 4, an image of pillars 1225 may be photo-patterned and/or etched through the foil 1205 to form pillars 1225 in the foil 1205. The pillars, for example, may be made from copper.

Figure 12B:
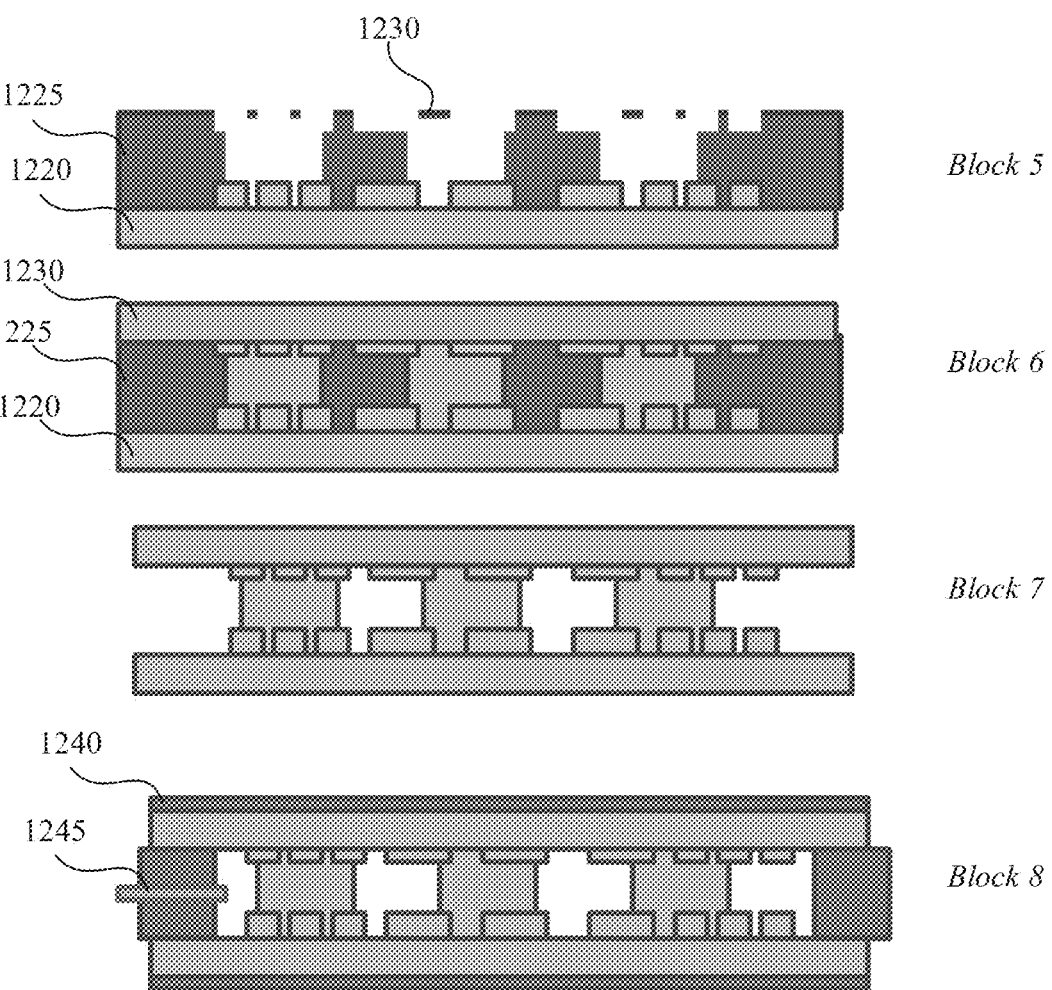

At block 5 in FIG. 12B, an additional micropillar scaffold may be created as a top wicking structure 1230.

At block 6, a polymer-coating may be applied on top of the wicking structure 1230, forming a secondary wick, pillars, and/or topmost structural layer.

At block 7, the pillars 1225 may be etched away leaving a vapor chamber.

At block 8, an ALD coating may be applied and/or the perimeter may be sealed. In some embodiments, a charge port 1245 may also be added for charging the TGP and may be sealed once charged.

Although illustrated as discrete blocks, various blocks of FIGS. 12A and 12B may be divided into additional blocks, combined into fewer blocks, or eliminated, depending on the desired implementation.

Figure 13:
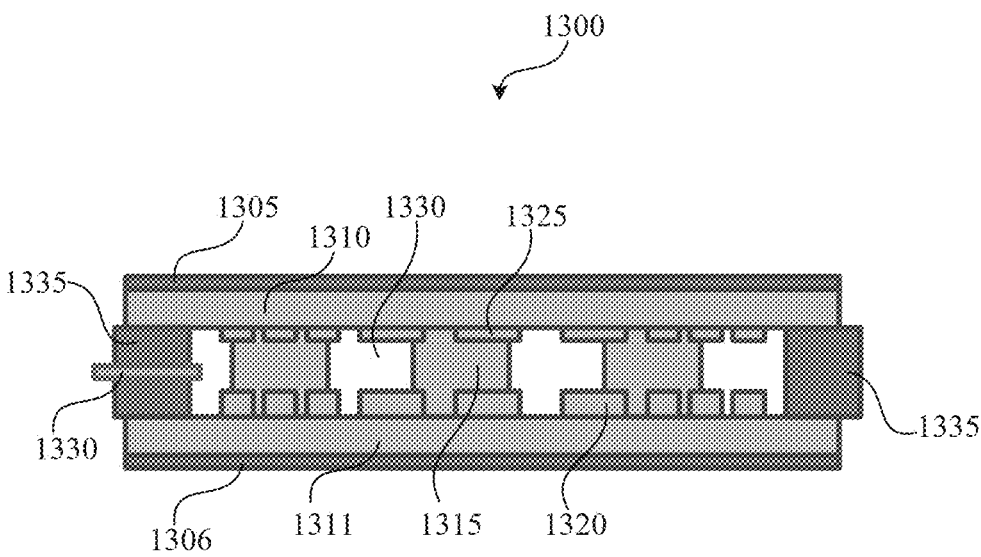
FIG. 13 illustrates an example thermal ground plane.

FIG. 13 illustrates a TGP 1300. The TGP 1300, for example, may be fabricated using the process shown in FIG. 12. The TGP 1300, for example, may have a thickness less than about 0.5 mm, 0.2 mm, 0.1 mm, 0.05 mm, etc.

The TGP 1300 includes a top cover coat 1305 and/or a bottom cover coat 1306. The top cover coat 1305 and/or the bottom cover coat 1306 may comprise fluorinated ethylene propylene or other polymer material.

The TGP 1300 may also include a top polymer layer 1310 and/or a bottom polymer layer 1311. The top polymer layer 1310 and/or the bottom polymer layer 1311 may comprise any type of polymer material such as, for example, polyimide.

A bottom mesh 1320 may deposed on or may be coupled with the bottom polymer layer 1310. The bottom mesh 1320 may comprise a polymer layer that may include a woven mesh or a plurality of pillars.

A top mesh 1325 may deposed on or may be coupled with the top polymer layer 1311. The top mesh 1325 may comprise a polymer layer that may include a woven mesh or a plurality of pillars. The top mesh 1325, for example, may be a condensate collection mesh.

The vapor core 1330 may be formed between the top mesh 1325 and the bottom mesh 1320. The vapor core may include a plurality of pillars 1315 that are disposed throughout the vapor core in any type of spacing between pillars 1315 and/or configurations. The bottom mesh 1320, for example, may be a condensate collection mesh.

Edge seal 1335 may form a seal the vapor chamber 1330. The edge seal 1335 may comprise fluorinated ethylene propylene or other polymer material.

In some embodiments, the TGP 1300 can be designed with a vapor-core 1330 and/or liquid-channel thickness designed by minimizing the thermal resistance through the TGP 1300 while adhering to the physical constraints that the TGP 1300 be less than 0.1 mm in total thickness and that the pressure drops associated with the liquid and vapor are smaller than the capillary pumping pressure.

Figure 14:
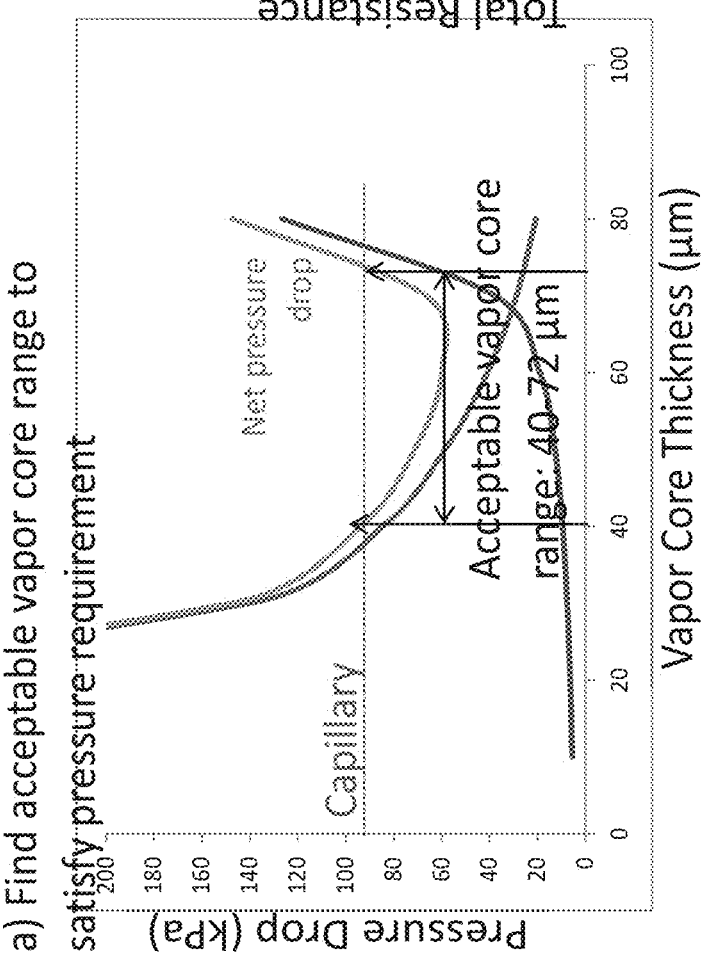
FIG. 14 is a graph illustrating optimal considerations for vapor core thickness.
Figure 15:
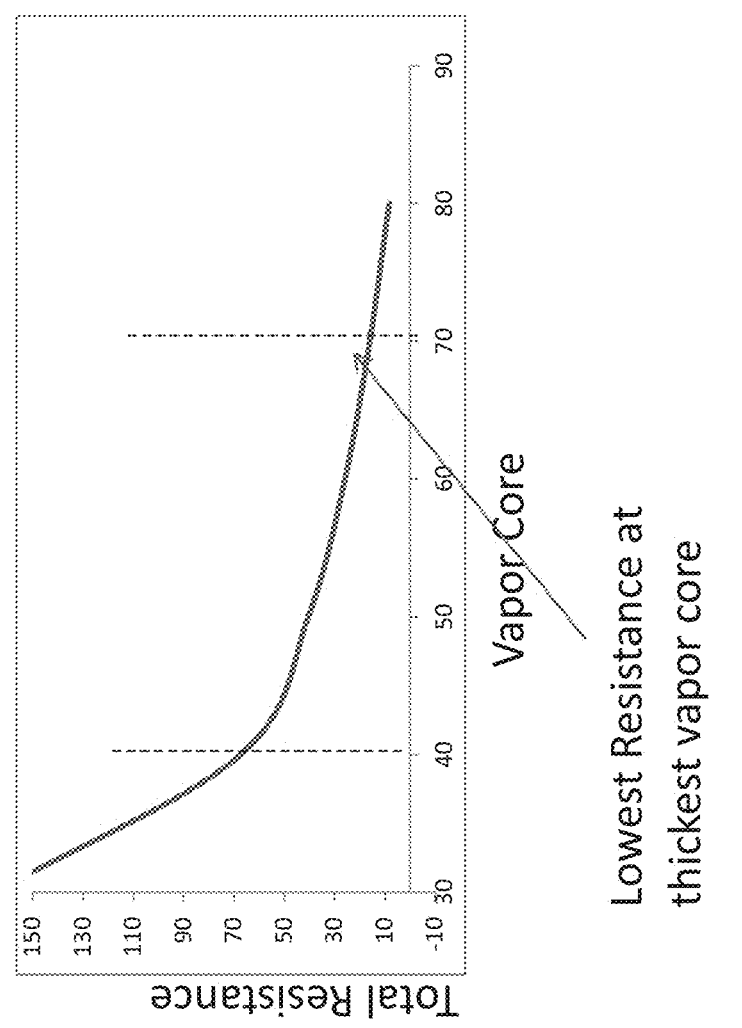
FIG. 15 is a graph illustrating optimal considerations for vapor core thickness.

This can be done, for example, as shown in FIG. 14 and/or FIG. 15, showing an example or optimal vapor core thickness of 0.065 mm for a device with a total thickness of 0.1 mm.

Figure 16:
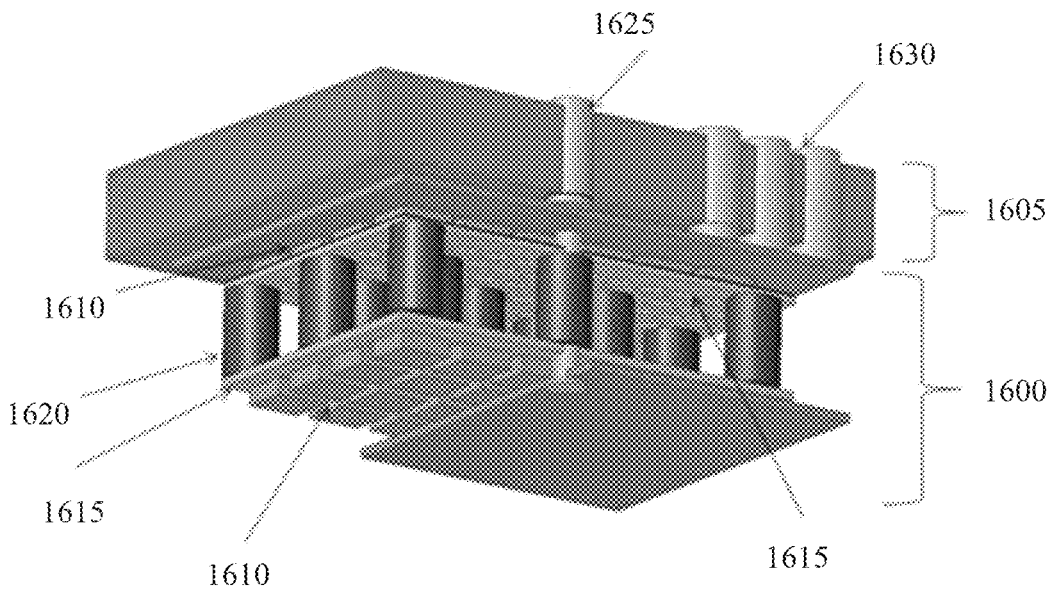
FIG. 16 illustrates a thermal ground plane integrated with a printed circuit board according to some embodiments.

In some embodiments, a thermal ground plane 1600 can be integrated with a printed circuit board (PCB) 1605 as shown in FIG. 16. The TGP 1600 includes liquid channels 1610, wicking mesh 1615, and/or vapor core pillars 1620. While two wicking mesh and liquid channels 1610 are shown, in some embodiments only one may be used. In some embodiments, heat may be transferred from one side of the TGP 1600 to the other side of TGP 1600. The liquid condensed on the bottom of the TGP 1600 may be collected and delivered back to the top of the TGP 1600. In some embodiments, one or two sets of wicking layers 1615 and/or liquid returning channels 1610 may be used. In some embodiments, electrical vias 1625 may pass through the TGP 1600. For example, vias 1625 may pass through the TGP 1600 through the vapor core pillars 1620. In some embodiments, heat generated in different components on the PCB 1605 may be transferred to the TGP 1600 through thermal vias 1630.

Figure 17:
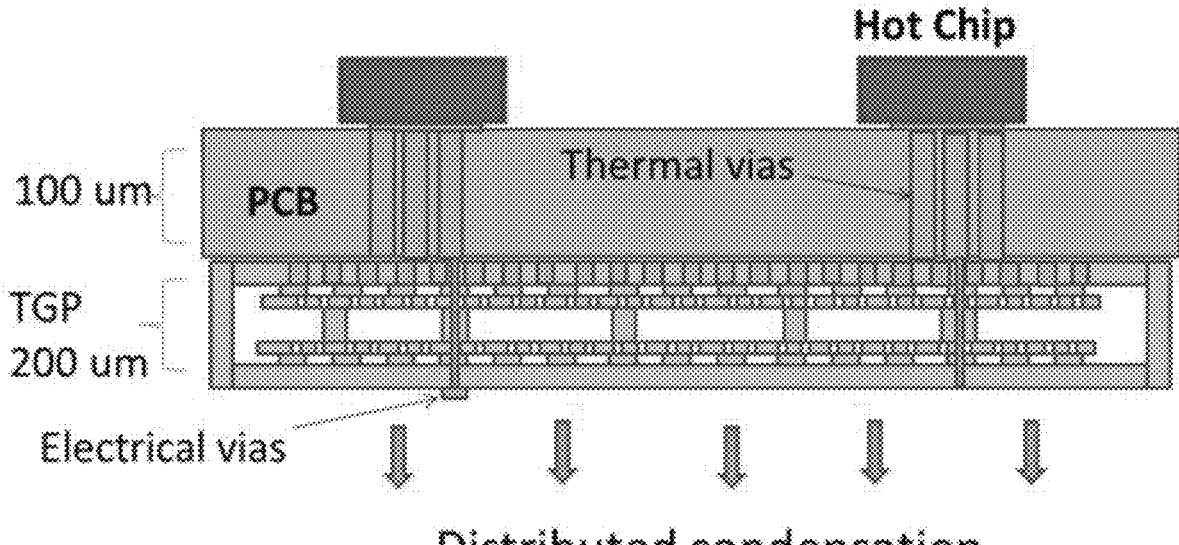
FIG. 17 illustrates a cross-sectional view of a TGP coupled with a PCB according to some embodiments.

FIG. 17 illustrates a cross-sectional view of a TGP coupled with a PCB according to some embodiments. Thermal vias and electrical vias and their connections to the TGP or through the TGP are illustrated in the figure. The double sets of wicking layers and liquid returning channels are also illustrated.

Figure 18A:
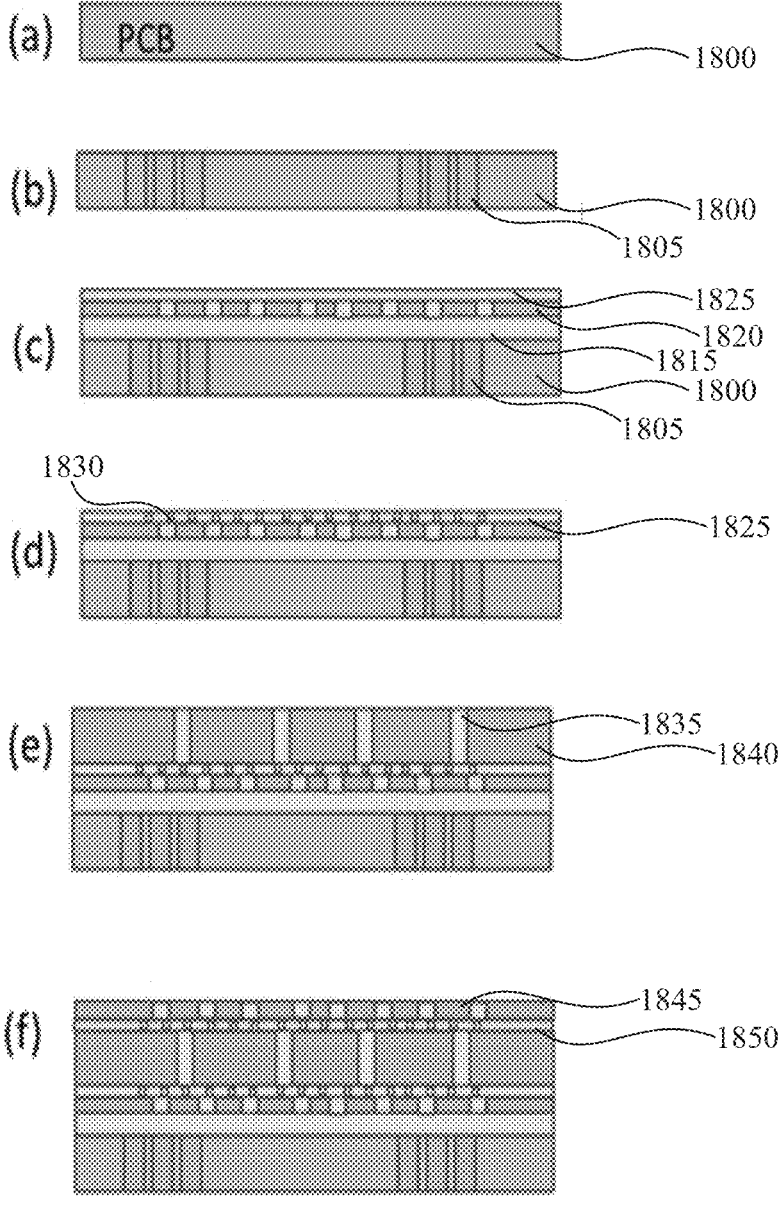
FIGS. 18A and 18B illustrate an example process for fabricating a TGP integrated with a PCB according to some embodiments.
Figure 18B:
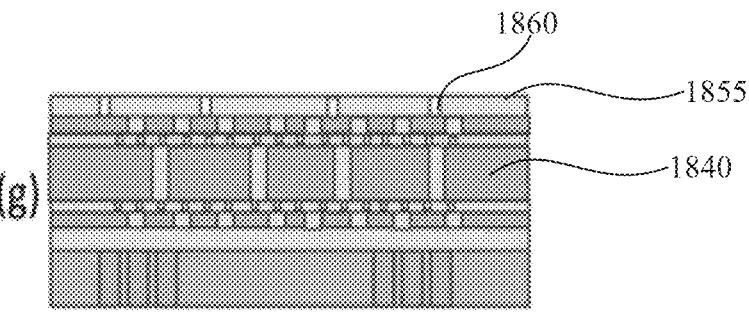
Figure 18B:
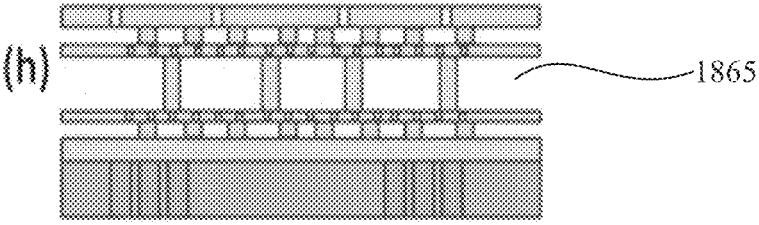

FIGS. 18A and 18B illustrate an example process for fabricating a TGP integrated with a PCB according to some embodiments. A PCB 1800 is provided in block (a). Thermal vias 1805 may be fabricated in the PCB 1800 as shown in block (b).

At block (c), various TGP layers may be fabricated on top of the PCB 1800. These TGP layers may include any TGP layer or structure described in this document. These layers may include, for example, a bottom polymer layer 1815; a bottom sacrificial layer 1820; and a bottom wicking polymer layer 1825. The bottom sacrificial layer 1820 may be a copper layer.

At block (d) the wicking polymer layer 1825 may be etched with a micro-structured pattern 1830.

At block (e) pillars 1835 may be fabricated. The pillars 1835 may comprise a polymer. The pillars 1835, for example, may be surrounded by a thick sacrificial copper layer 1840. When the sacrificial copper layer 1840 is removed, the resulting space may form the vapor core of the TGP.

At block (f) a top polymer wicking layer 1850 and/or a liquid returning channel 1845 layer may be fabricated.

At block (g) in FIG. 18B the fabrication of the multilayered structures may be completed with the top enclosure layer 1855 with release holes 1860 etched. These release holes 1860 may be needed to introduce liquid or vapor etchant to remove the sacrificial copper layer 1840 and/or other layers.

At block (h) the sacrificial copper layer 1840 and/or other layers may be removed by etchant introduced through the release holes 1860. The vapor core 1865 may be created with the removal of the sacrificial copper layer 1840. Other wicking and/or mesh layers may also be formed with the removal of the sacrificial copper layer 1840.

At block (i) various portions within the TGP structure may be coated with atomic layer deposition layers for hydrophilic or hydrophobic properties and/or for sealing polymer from water to be charged. Hermetic sealing of polymer may be important in some embodiments because outgassing from the polymer could generate non-condensable gas that would degrade TGP performance. In addition, the release holes will be sealed by another polymer, glass or metal materials.

At block (j) the air inside the structure may be sealed and/or may be vacuum-removed, after which water may be charged into the structure. In some embodiments, the charging port can be a copper tube or polymer connectors to be hermetically sealed by additional atomic layer deposition.

At block (k) the charging port may be sealed after charging.

At block (i) an ALD coating may be applied to encapsulate the entire exterior surface of the TGP to hermetically seal the entire system. Various other sealing techniques may be used before or after charging of the TGP. It should be noted that all the ALD coatings mentioned herein can be replaced by other coating processes such as chemical vapor deposition or physical metal deposition processes.

In some embodiments a single set of wicking layer and/or liquid returning channel layers may be applied for a thinner TGP with evaporators and condensers placed on the same side of the TGP.

Figure 19A:
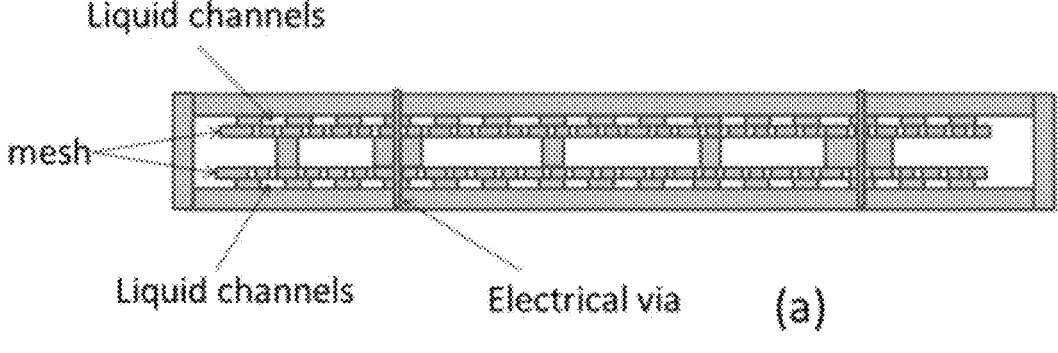
FIG. 19A illustrates electrical vias fabricated through the polymer layers in a TGP according to some embodiments.
Figure 19B:
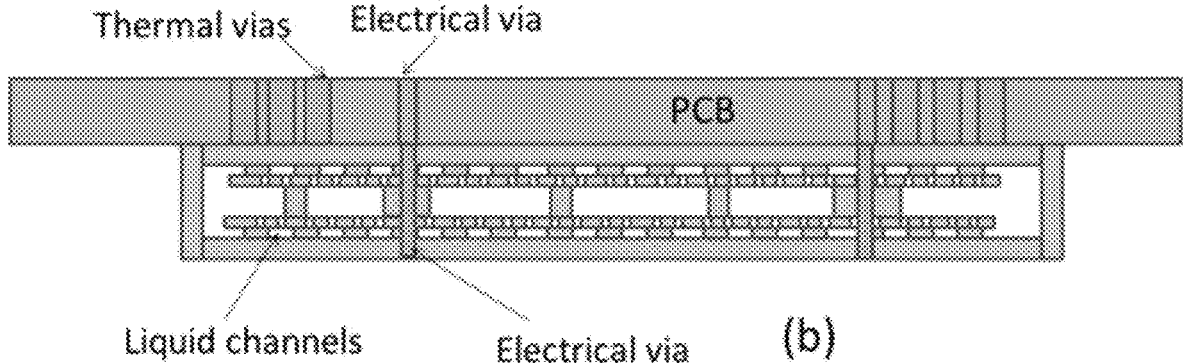
FIG. 19B illustrates electrical vias in a TGP that can be connected to electrical interconnects, vias or bonding pads on the PCB.

FIG. 19A illustrates electrical vias fabricated through the polymer layers in a TGP according to some embodiments. Such a via fabrication process can include hole drilling process followed by electroplating used by PCB manufacturing. FIG. 19B illustrates electrical vias in a TGP that can be connected to electrical interconnects, vias or bonding pads on the PCB.

Figure 20:
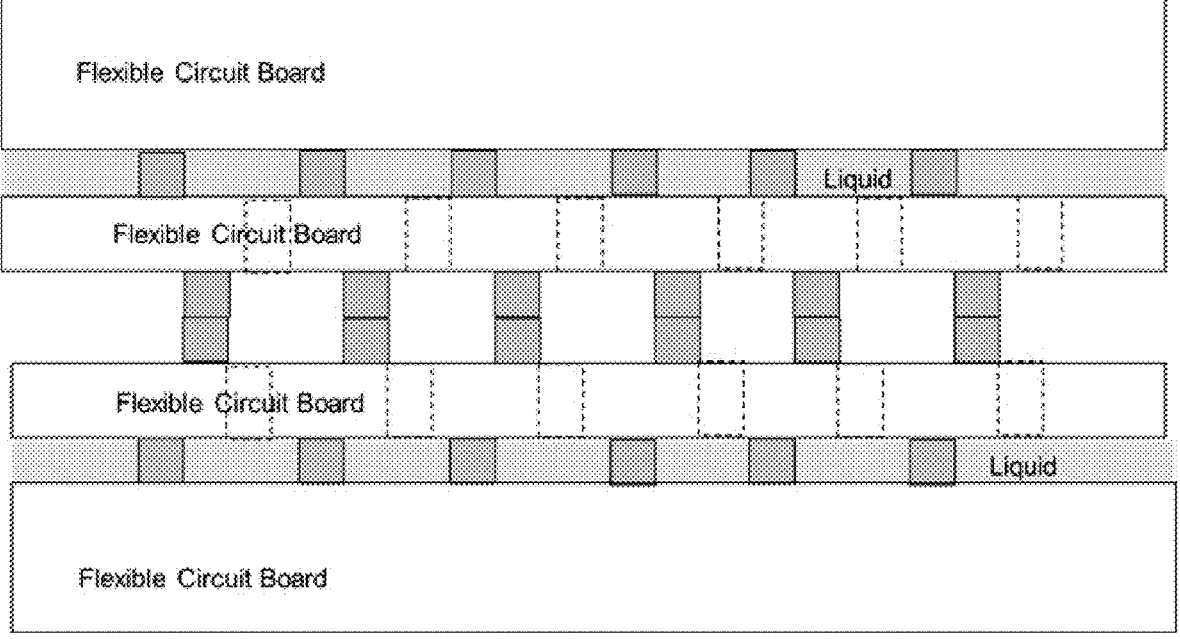
FIG. 20 illustrates several pre-fabricated flexible circuit boards laminated into a single PCB with a TGP according to some embodiments

In some embodiments, several pre-fabricated flexible circuit boards can be laminated into a single PCB with TGP integrated as illustrated in FIG. 20. The top and the bottom flexible circuit boards can carry electronic components. The flexible circuit boards can be fabricated with different structures for wicking, vapor core and liquid returning channels.

Some embodiments of the invention may use a mixture of liquids as the heat transfer fluid. For example, some embodiments, may use some combination of water, acetone, isopropanol, ethanol, methanol, etc., as the heat transfer fluid. Some embodiments may use other natural and artificial fluids as the components of the heat transfer fluid. Some embodiments may use azetropic fluid mixtures whereby the vapor and liquid compositions are the same. Some embodiments may use non-azetropic mixtures, whereby the vapor-phase composition differs from the liquid-phase composition.

Some embodiments of the invention may use a fluid composed of a high surface tension liquid (e.g. water, ammonia, etc., or mixtures thereof) and a high vapor pressure fluid (e.g. acetone, isopropanol, ethanol, etc. and mixtures thereof).

Figure 21:
FIG. 21 illustrates a top view of a TGP according to some embodiments.
Figure 21:
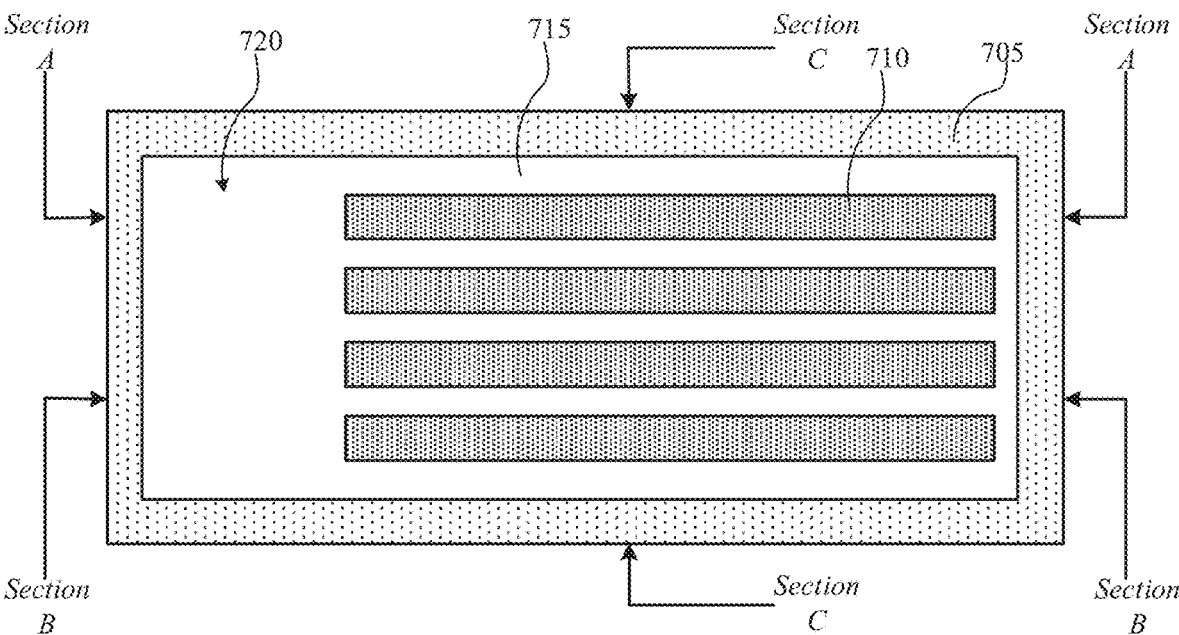

FIG. 21 illustrates a top view of another TGP 700 and FIGS. 22A, 22B, and 22C illustrate side views of the TGP 700 according to some embodiments. The TGP 700 includes a top layer (805 in FIG. 22) and a bottom layer 705. FIG. 21 shows the TGP 700 with the top layer 805 removed. The top layer 805 and/or the bottom layer 705 may include copper and/or polyimide material. In some embodiments, the top layer 805 and/or the bottom layer 705 may include layers of both copper and polyimide.

The TGP 700 includes a mesh return layer 715 that includes a plurality of return arteries 710 formed or cut within the mesh return layer 715. In some embodiments, the return arteries 710 may not extend into the evaporator region 720 of the TGP 700. In some embodiments, the width of the return arteries 710 may be less than 30 microns. In some embodiments, the width of the return arteries 710 may be less than 100 microns. In some embodiments, the mesh return layer 715 may include a wick. In some embodiments, the mesh return layer 715 may include a steel mesh such as, for example, a mesh with wires that are less than 50 microns or 25 microns thick. In some embodiments, the mesh return layer 715 may include a mesh with a simple weave at 200, 300, 400, 500, 600, 700, etc. wires/inch. In some embodiments, the mesh return layer 715 may be electroplated with copper. The mesh return layer 715 may include a specified evaporator region that may provide a specific location for a heat source. In some embodiments, the mesh return layer 715 may have a thickness of about 40 microns.

The mesh return layer 715 may have any number of shapes and/or configurations. In some embodiments, the mesh return layer 715 may have a polygonal or circular shape. In some embodiments, the mesh return layer 715 may have multiple sections without return arteries 710. In some embodiments, the mesh return layer 715 may include any number, shape or configuration of return arteries 710. In some embodiments, the return arteries 710 may have one or more pillars or other mechanisms disposed within the return arteries 710.

In some embodiments, return pillars 835 (see FIG. 22) may extend from the bottom layer 705 through the return arteries 710 of the mesh return layer 715. In some embodiments, the return pillars 835 may form vapor regions running parallel to the mesh return layer 715. In some embodiments, the return pillars 835 may form arteries in the adiabatic and/or condenser regions of the TGP 700.

The return pillars 835 may have at least one dimension that is smaller than the width of the return arteries 710. In some embodiments, these pillars may have at least one dimension (e.g., height, width, length, diameter, etc.) that is less than 10 microns. In some embodiments, these pillars may have at least one dimension (e.g., height, width, length, diameter, etc.) that is less than 50 microns. In some embodiments, these pillars may have at least one dimension (e.g., height, width, length, diameter, etc.) that is less 100 microns.

FIG. 22A shows a side view of TGP 700 cut through Section A shown in FIG. 21. In FIG. 22A, the TGP 700 is cut through a region where a return arteries 710 extends along a portion of the mesh return layer 715. As shown in FIG. 22A, the mesh return layer 715 is present in the evaporator region. The return pillars 835 are shown extending through the return arteries 710. The TGP 700 also includes a plurality of top pillars 825 disposed on the top layer 805. The top pillars 825 may have at least one dimension (e.g., height, width, length, diameter, etc.) that is larger than the return pillars 835. The top pillars 825 may have at least one dimension (e.g., height, width, length, diameter, etc.) that is larger than 0.25 mm, 0.5 mm, 0.75 mm, 1.0 mm, 1.25 mm, etc.

In some embodiments, the TGP 700 may include a micro wick layer 815. The micro wick layer 815, for example, may include a plurality of pillars (e.g., electroplated pillars). The micro wick layer 815 may have at least one dimension (e.g., pillar height, width, length, diameter, pitch, etc.) that is smaller than the return pillars 835. The micro wick layer 815 may have at least one dimension (e.g., height, width, length, diameter, etc.) that is smaller than 5 μm, 10 μm, 15 μm, 20 μm, 25 μm, etc. The micro wick layer 815 may be aligned with the return arteries 710.

FIG. 22B shows a side view of TGP 700 cut through Section B shown in FIG. 21. In FIG. 22B, the TGP is cut through a region without the return arteries 710 extending along a portion of the mesh return layer 715. Instead, the mesh return layer 715 extends along the length of the TGP 700 along this section of the TGP 700.

FIG. 22C shows an end view of TGP 700 cut through Section C shown in FIG. 21. In FIG. 22C, the TGP is cut through the mesh return layer 715 showing both the mesh return layer 715 and the return arteries 710 formed in the mesh return layer 715. In some embodiments, the return pillars 835 may extend through the return arteries 710. In some embodiments, one or more of the return pillars 835 may contact one or more of the top pillars 825.

In some embodiments, the top layer 805 and the bottom layer 705 are sealed along at least one edge of the top layer 805 and along at least one edge of the bottom layer 705. In some embodiments, the top layer 805 and the bottom layer 705 are sealed along at least two edges of the top layer 805 and along at least two edges of the bottom layer 705.

In some embodiments, a buffer region can be created by design to collect and store any non-condensable gas through passive convection. For example, a space of a few millimeters can be formed in the area outside the mesh (e.g., outside the mesh region shown in FIG. 6). This space can be added prior to bonding. This space may collect any non-condensable gases that would move to this space because of its different density, and thus its effect on evaporation and condensation can be reduced substantially.

Various other sealing techniques may be used such as, for example, thermosonic or thermo-compression bonding, ultrasonic welding, laser welding, electron beam welding, electroplating; solder sealing with alloys with negligible reaction with water; and polymer bonding encapsulated by moisture barrier coatings such as atomic layer deposition (ALD)-based coatings.

Some embodiments may include a pillar-enabled TGP. In some embodiments, the TGP may include a copper-cladded Kapton film that includes three layers. These layers may, for example, include copper and Kapton layers. Each layer may be about 12 um thick. In some embodiments, a stainless steel woven mesh may be included and may have a thickness less than 75 um. In some embodiments, the pillars may allow for fluid and/or vapor transport between the pillars under different mechanical loadings.

In some embodiments, a plurality of pillars may be formed on a copper layer (e.g., the top layer and/or the bottom layer) using any of various lithography lithographic patterning processes.

In some embodiments, a copper-encapsulated stainless steel mesh may be sandwiched between the top layer and the bottom layer. The stainless steel mesh, for example, may have a weave that is less than 75 microns in thickness. In some embodiments, the mesh may be copper encapsulated. In some embodiments, the mesh may be hydrophilic. In some embodiments, the reaction of the mesh with water may be negligible.

In some embodiments, a TGP may include a mesh-pillar wicking structure. The mesh-pillar wicking structure may allow the TGP to achieve a low capillary radius (high p umping pressure) in the evaporation regions and/or a higher flow hydraulic radius (low flow pressure drop) in the fluid channel.

In some embodiments, a TGP may include pillars with rounded heads. For example, the pillars may be formed with controlled over-plating. In some embodiments, the pillars may form very sharp angle at the interface between a pillar and the mesh bonded. In some embodiments, these sharp angles may be used, for example, to enhance the capillary p umping force pulling the liquid returned from the condenser to the evaporator.

In some embodiments, a plurality of star-shaped pillars may be constructed on either the top layer and/or the bottom layer that have a star-shaped polygon various cross section.

In some embodiments, a plurality of hydrophilic pillars may be constructed on either the top layer and/or the bottom layer.

In some embodiments, heat rejection through condensation can be distributed throughout the external surface of the TGP.

In some embodiments, pillars and/or spacers may be disposed on a layer with densities (spacing between pillars or spacers) that vary across the layer, with diameters that vary across the layer, with spacing that vary across the layer, etc.

The Figures are not drawn to scale.

The term "substantially" means within 5% or 10% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A thermal ground plane comprising: a bottom layer, having edges;
   a top layer, having edges, wherein the top layer and the bottom layer are sealed together along the edges of the top layer and the edges of the bottom layer;
   a mesh layer disposed on the bottom layer, the mesh layer comprising a plurality of wires and having a plurality of elongated arteries cut within the mesh layer that extend along a portion of a length of the mesh layer and each of the elongated arteries are arranged in parallel; and a plurality of top pillars disposed on the top layer and do not extend through the plurality of arteries.

2. The thermal ground plane according to claim 1, wherein each of the plurality of arteries are cut within the mesh layer.

3. The thermal ground plane according to claim 1, further comprising a plurality of return pillars disposed on the bottom layer, the plurality of return pillars disposed within and extending through the plurality of arteries.

4. The thermal ground plane according to claim 1, wherein each of the plurality of top pillars comprises at least one dimension greater than a corresponding dimension of the return pillars.

5. The thermal ground plane according to claim 3, wherein a subset of the plurality of top pillars are in contact with one or more of a subset of the plurality of return pillars.

6. The thermal ground plane according to claim 1, further comprising a micro wick layer disposed between the bottom layer and the mesh layer.

7. The thermal ground plane according to claim 6, wherein the mico wick layer comprises a plurality of top pillars comprising at least one dimension that is smaller than a corresponding dimension of the return pillars.

8. The thermal ground plane according to claim 1, wherein the plurality of wires have a diameter less than about 50 microns thick.

9. The thermal ground plane according to claim 1, wherein the mesh layer has a thickness of about 40 microns.

10. The thermal ground plane according to claim 1, wherein the mesh layer comprises a steel mesh encapsulated with copper.

11. The thermal ground plane according to claim 1, wherein either or both the bottom layer and the top layer comprise either or both copper and polyimide.

12. The thermal ground plane according to claim 1, further comprising an evaporator region, wherein the plurality of arteries do not extend into the evaporator region.

13. The thermal ground plane according to claim 1, wherein a subset of the top pillars are in contact with one or more of a subset of the return pillars.

14. The thermal ground plane according to claim 1, wherein either or both the top layer or the bottom layer comprise wavy structures.

15. The thermal ground plane according to claim 1, wherein the mesh layer comprises wavy structures.

16. A thermal ground plane comprising: a bottom layer having edges;

a top layer having edges, wherein the top layer and the bottom layer are sealed together along the edges of the top layer and the edges of the bottom layer;

a mesh layer disposed on the bottom layer, the mesh layer comprising a plurality of arteries cut through the mesh layer, the plurality of arteries extend along a portion of a length of the mesh layer;

a plurality of top pillars disposed on the top layer, the plurality of top pillars extend from the top layer substantially to the mesh layer, and a plurality of return pillars disposed on the bottom layer, the plurality of return pillars disposed within and extending through the plurality of arteries.

17. The thermal ground plan according to claim 16, wherein the bottom layer comprises a polymer; the top layer comprises a polymer; and/or the mesh layer comprises a polymer.

18. The thermal ground plane according to claim 16, wherein each of the plurality of top pillars comprises at least one dimension greater than a corresponding dimension of the return pillars.

19. The thermal ground plane according to claim 16, wherein a subset of the plurality of top pillars are in contact with one or more of a subset of the plurality of return pillars.

20. The thermal ground plane according to claim 16, further comprising an evaporator region, wherein the plurality of arteries do not extend into the evaporator region.

21. The thermal ground plane according to claim 1, wherein the mesh layer comprises a woven mesh.

22. The thermal ground plane according to claim 1, wherein the mesh layer comprises a polymer mesh.

23. The thermal ground plane according to claim 16, wherein the mesh layer comprises a woven mesh.

24. The thermal ground plane according to claim 1, wherein the mesh layer comprises a metallic mesh.

* * * * *